(12) United States Patent
Dickson et al.

(10) Patent No.: US 9,942,028 B1
(45) Date of Patent: Apr. 10, 2018

(54) SERIAL TRANSMITTER WITH FEED FORWARD EQUALIZER AND TIMING CALIBRATION

(71) Applicant: INTERNATIONAL BUSINESS MACHINES CORPORATION, Armonk, NY (US)

(72) Inventors: Timothy O. Dickson, Danbury, CT (US); Mounir Meghelli, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/423,106

(22) Filed: Feb. 2, 2017

Related U.S. Application Data

(63) Continuation-in-part of application No. 15/423,024, filed on Feb. 2, 2017.

(51) Int. Cl.
*H04L 7/00* (2006.01)
*H04L 7/033* (2006.01)

(52) U.S. Cl.
CPC .......... *H04L 7/0058* (2013.01); *H04L 7/0091* (2013.01); *H04L 7/0338* (2013.01)

(58) Field of Classification Search
CPC ......... H04L 25/03343; H04L 25/03878; H04L 25/028; H04L 25/03885; H04L 7/0087; H04L 2025/03808; H04L 27/01; H04L 7/0334; H04L 7/0058; H04L 7/0338; H04L 7/0091
See application file for complete search history.

(56) References Cited

U.S. PATENT DOCUMENTS

| 7,570,071 B2 | 8/2009 | Clements et al. |
| 8,385,401 B2 | 2/2013 | Miller |
| 8,520,724 B2 | 8/2013 | Kossel et al. |

(Continued)

OTHER PUBLICATIONS

Bulzacchelli el al., "A 28-Gb/s 4-Tap FFE/15-Tap DEF Serial Link Tramsceiver in 32-nm SOI CMOS Technology," IEEE Journal of Solid-State Circuits, vol. 47, No. 12, pp. 3232-3248, Dec. 2012.

(Continued)

*Primary Examiner* — Vineeta Panwalkar
(74) *Attorney, Agent, or Firm* — Intelletek Law Group, PLLC; Gabriel Daniel, Esq.

(57) ABSTRACT

A timing error detection circuit for calibrating a serial transmitter is disclosed. The circuit includes a data source configured to provide data for serial transmission and a clock source configured to produce N versions of a sampling clock that are at N different phases of the sampling clock. The detection circuit has a first sampler configured to sample the data source by using a first phase of the sampling clock to generate a first sampled signal and a second sampler configured to sample the data source by using a second phase of the sampling clock to generate a second sampled signal. The detection circuit also includes a first comparator configured to compare the first and second sampled signals to generate a difference signal and a first low-pass filter configured to filter the difference signal to generate an average difference voltage. A second comparator in the detection circuit is configured to compare the average difference voltage with a reference voltage.

20 Claims, 18 Drawing Sheets

(56) References Cited

U.S. PATENT DOCUMENTS

| | | |
|---|---|---|
| 8,618,833 B1 | 12/2013 | Bergkvist et al. |
| 8,878,568 B1 | 11/2014 | Farzan et al. |
| 8,989,254 B2 | 3/2015 | Jing et al. |
| 9,094,239 B1 | 7/2015 | Luo et al. |
| 9,281,969 B2 | 3/2016 | Gondi et al. |
| 9,385,898 B2 | 7/2016 | Kizer et al. |
| 9,419,827 B2 | 8/2016 | Thakkar et al. |
| 2005/0002475 A1* | 1/2005 | Menolfi ............... H04L 7/0334 375/340 |
| 2005/0249275 A1 | 11/2005 | Yen et al. |
| 2011/0018599 A1* | 1/2011 | Abbasfar .......... H04L 25/03878 327/158 |
| 2014/0119424 A1 | 5/2014 | Francese et al. |
| 2015/0110165 A1 | 4/2015 | Ramadoss et al. |
| 2016/0006596 A1 | 1/2016 | Dickson et al. |

OTHER PUBLICATIONS

Chen et al., "A Novel SST Transmitter With Mutually Decoupled Impedance Self-Calibration and Equalization," IEEE 2011 (978-1-4244-9474-3).

Gitlin et al., "Fractionally-Spaced Equalization: An Improved Digital Transversal Equalizer," The Bell System Technical Journal, vol. 60, No. 2, Feb. 1981.

Liu et al., "A Novel 6-Gbs Half-Rate SST Transmitter With Impedance Calibration and Adjustable Pre-Emphasis," IEEE 2015 (978-1-4799-8391-9).

Momtaz et al., "An 80mW 40Gb/s 7-TAP T/2-Spaced FFE in 65nm CMOS," IEEE International Solid-State Circuits Conference (ISSCC), Feb. 2009.

Momtaz, et al., "An 80 mW 40 Gb/s 7-Tap T/2-Spaced Feed-Forward Equalizer in 65 nm CMOS," IEEE Journal of Solid-State Circuits, vol. 45, No. 3, pp. 629-639, Mar. 2010.

* cited by examiner

SERIAL TRANSMITTER WITH FEED FORWARD EQUALIZER AND TIMING CALIBRATION

FEDERALLY SPONSORED RESEARCH OR DEVELOPMENT

This invention was made with Government support under Contract No. H98230-12-C-0325, project unidentified. The Government has certain rights to this invention.

BACKGROUND

Technical Field

The present disclosure generally relates to architectures for serial data link transmitters employing pulse amplitude modulation (PAM) transmitter architectures utilizing quadrature clock phases.

Description of the Related Art

Demands for high-bandwidth data transmissions continue to increase for systems such as servers and high-speed routers. Non-return-to-zero (NRZ) modulation has been commonly employed in such data communication links. In NRZ systems, a single bit of information is conveyed in each data symbol transmitted. This has historically been preferred in many electrical links over other modulation schemes such as pulse amplitude modulation. In 4-level pulse amplitude modulation (PAM-4) serial links, two bits of information are conveyed in each data symbol. This results in better spectral efficiency than NRZ data transmission, which is advantageous when transmitted over bandwidth-limited channels.

SUMMARY

Some embodiments of the disclosure provide a serial transmitter. The serial transmitter includes a serial output port that outputs one symbol every unit interval (UI) from a data source. The serial transmitter also includes a plurality of driver segments that jointly drive the serial output port. Each driver segment is configured to use one of N phases of a sampling clock to serialize and transmit data from the data source. Different sets of the driver segments are configured to select different phases of the sampling clock for serializing and transmitting data, the sampling clock being a half-rate clock having a period of two UI. In some embodiments, each driver segments includes a set of latch-multiplexers that are configured to select and output data bits from the data source based on a quarter-rate sampling clock and a half-rate sampling clock. The quarter-rate sampling clock is selected from one of 4 phases of a quarter-rate clock and the half-rate sampling clock is selected from one of 4 phases of a half-rate clock. Each driver segment also includes a segment output driver that drives the output of the 2:1 latch-multiplexer.

Some embodiments of the disclosure provide a computer-implemented method for configuring a serial transmitter. The method receives configuration data for configuring a plurality of driver segments of the serial transmitter to serialize and transmit data from a data source. The plurality of driver segments jointly drives a serial output port of the serial transmitter that outputs one symbol every unit interval (UI). Based on the configuration data, the method configures a first set of driver segments based on the configuration data to select a first phase of a sampling clock for serializing data from the data source and a second set of driver segments to select a second phase of a sampling clock for serializing data from the data source. The sampling clock is a half-rate clock having a period of two UI.

Some embodiments of disclosure provide an integrated circuit (IC) having a timing error detection circuit for calibrating a serial transmitter. The circuit includes a data source configured to provide data for serial transmission and a clock source configured to produce N versions of a sampling clock that are at N different phases of the sampling clock. The detection circuit has a first latch-multiplexer configured to sample the data source by using a first phase of the sampling clock to generate a first sampled signal and a second latch-multiplexer configured to sample the data source by using a second phase of the sampling clock to generate a second sampled signal. The detection circuit also includes a first comparator configured to compare the first and second sampled signals to generate a differential signal and a first low-pass filter configured to filter the differential signal to generate an average differential voltage. A second comparator in the detection circuit is configured to compare the average differential voltage with a reference voltage, as well as a second low-pass filter that is configured to generate the reference voltage by filtering a square wave having a particular duty cycle of 1/N.

Some embodiments of the disclosure provide a computer-implemented method for calibrating a serial transmitter by using the timing error detection circuit. The method configures a timing error detection circuit of a serial transmitter to compare data that are sampled from a data source by using first and second phases of a sampling clock. The first and second phases are used for generating data for adjacent taps of a feed-forward equalizer (FFE) of the serial transmitter. The method also receives a timing error indication from the timing error detection circuit. The indication is generated by (i) comparing data latched by sampling clocks of different phases, (ii) computing, via low-pass filtering, a voltage corresponding to the average value of the data comparison, and (iii) comparing the average difference voltage with a reference voltage to see if the average difference voltage is greater than a threshold as to indicate a timing error. In some embodiments, the reference voltage that is generated by averaging a square wave of a particular duty cycle that is determined based on a timing spacing between the first and second phases of the sampling clock. Based on the timing error indication, the method configures the serial transmitter to use different phases as the sampling clocks for the adjacent taps of the FFE based on the timing error indication.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Figure 1:
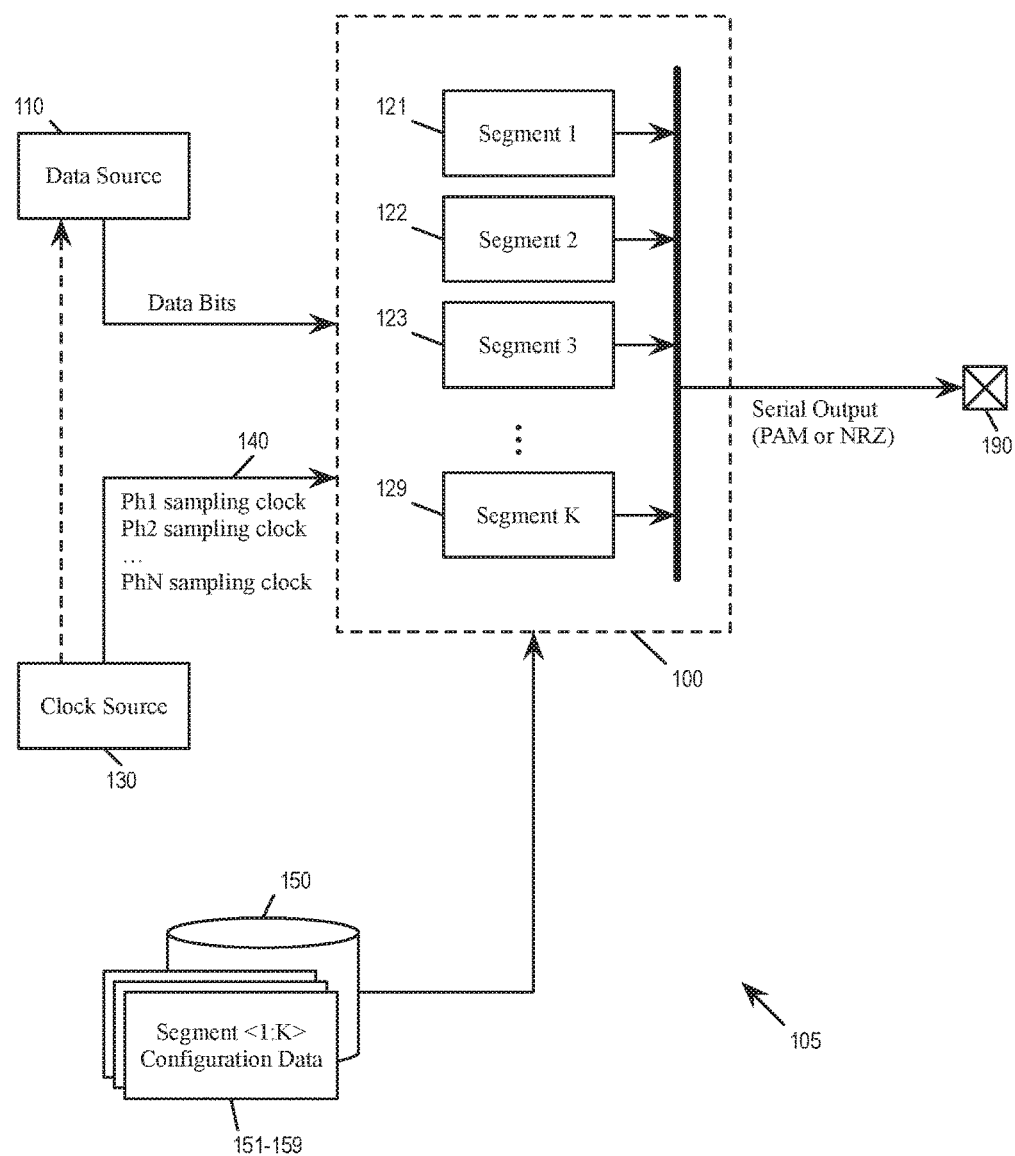
FIG. 1 illustrates a serial transmitter, consistent with an exemplary embodiment of the invention.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

As data rates in serial links increase beyond 50 Gb/s, multi-level signaling techniques such as 4-level pulse amplitude modulation (PAM4) are finding increased use in electrical as well as optical serial link applications. A serial PAM4 communication link transmits 2 bits of information per symbol at each unit interval (UI or baud) as compared to more traditional non-return-to-zero (NRZ) modulation schemes (also known as 2-level pulse amplitude modulation, or PAM2). PAM4 modulation has multiple edge transitions that lead to reduced timing margin (or horizontal eye opening) as compared to NRZ data at the same symbol rate. Consequently, PAM4 requires higher bandwidth I/O circuitry to avoid excessive vertical and/or horizontal eye closure.

Some embodiments of the disclosure provide a serial transmitter architecture with a higher bandwidth continuous time analog amplifiers and discrete time digital finite impulse response (FIR) filters with reduced tap spacing, specifically, a transmitter feed forward equalizer (FFE) with half-UI (also known as half-baud, or T/2) spaced taps. The serial transmitter architecture employs a source-series terminated (SST) driver and multiple driver segments with varying impedances that are placed in parallel. Each driver segment (also referred to as SST segment) can be independently configured to achieve the desired FFE tap. Specifically, each driver segment is independently configurable to select a clock phase that corresponds to a specific FFE tap (e.g., pre-, post-, or main cursor tap) and to deliver data at timing based on the selected clock phase.

In some embodiments, the serial transmitter can be configured to uses a half-rate (C2) clock to achieve an FFE with half-baud (or T/2 or half-UI) spaced taps or to use a quarter-rate (C4) clock to achieve an FFE with baud (or T or UI) spaced taps. Each driver segment of the serial transmitter includes a phase selection circuit to determine which quadrature phase of C2 and/or C4 is used to clock data. To improve timing margins and to make the design more robust to process variations, the serial transmitter architecture includes a calibration circuit to determine which clock phases should be selected for segments that are respectively configured as pre-, post-, or main cursor taps.

For some embodiments, the serial transmitter architecture can be generalized as a structure capable of supporting FFE taps that are separated by fractional UI. The generalized serial transmitter includes a serial output port that outputs one PAM symbol every UI (i.e., at full rate or full symbol rate). The serial transmitter includes an array of driver segments that jointly drive the serial output port. Each driver segment is configured to use one of N phases of a sampling clock for sampling data bits from a data source and for selecting and driving one sampled data bit as output every half sampling clock cycle. The sampling clock is a half-rate clock with a period that is twice as long as a UI. Each FFE tap is implemented by a set of driver segments that are configured to use a sampling clock phase that corresponds to the timing of the FFE tap. As such, the outputs driven by driver segments of adjacent FFE taps are temporally separated by 1/N sampling clock cycle, or 2/N UI. This allows for the implementation of an FFE with N−1 taps. Higher FFE tap counts could be supported through the inclusion of a 'first-in first-out' (FIFO) structure or a set of digital shift registers, either after the data source or within the driver segments, as could be devised by one skilled in the art.

FIG. 1 illustrates a serial transmitter 100, consistent with an exemplary embodiment of the invention. The serial transmitter 100 is a set of circuits for transmitting serial data from a device 105 over a serial link. Such a device can be an integrated circuit (IC), or an electronic device having several ICs and other types of electronic components. As illustrated, the serial transmitter receives data from a data source 110 in the device 105 and drives a serial output signal at a serial output port 190 of the device 105. The serial output port transmits one symbol per UI over a serial link. The serial output signal can be a NRZ (i.e., PAM2) signal that encodes one bit in each symbol or a multi-level PAM signal (e.g., PAM4) that encodes multiple bits in each symbol.

The data source 110 generally refers to circuits in the device 105 that are generating data to be delivered serially. In some embodiments, the data source 110 provides an array of data bits to be selected for serial transmission by the serial transmitter 100.

The clock source 130 supplies the clocks for operating the serial transmitter 100 as well as for synchronizing the delivery of data bits from the data source 110 to the serial transmitter 100. The clock source supplies a set of sampling clocks 140 at different phases to the serial transmitter 100. In some embodiments, the clock source 130 includes a PLL for generating quadrature clock phases, i.e., 4 versions of the same clock that are 90 degrees apart in phases. The clock source also supplies a divided clock based on the sampling clock to the data source 110 for synchronizing the delivery of the data bits to the serial transmitter 100. For some embodiments in which the sampling clock is a half-rate clock, the divided clock is a quarter-rate clock.

The serial transmitter 100 includes an array of driver segments 121-129 that jointly drive the full-rate serial output signal at the serial output port 190 based on data bits received from the data source 110. Each driver segment 121-129 receives the set of sampling clocks 140 from the clock source 130 for serializing the received data bits. Each driver segment is configured to select and use one of the sampling clocks (i.e., one of the N phases) for multiplexing and latching data bits at that driver segment. The driver segments are configured by a configuration data store 150, which has corresponding configuration data sets 151-159 for configuring each of the driver segment 121-129, respectively.

Figure 2:
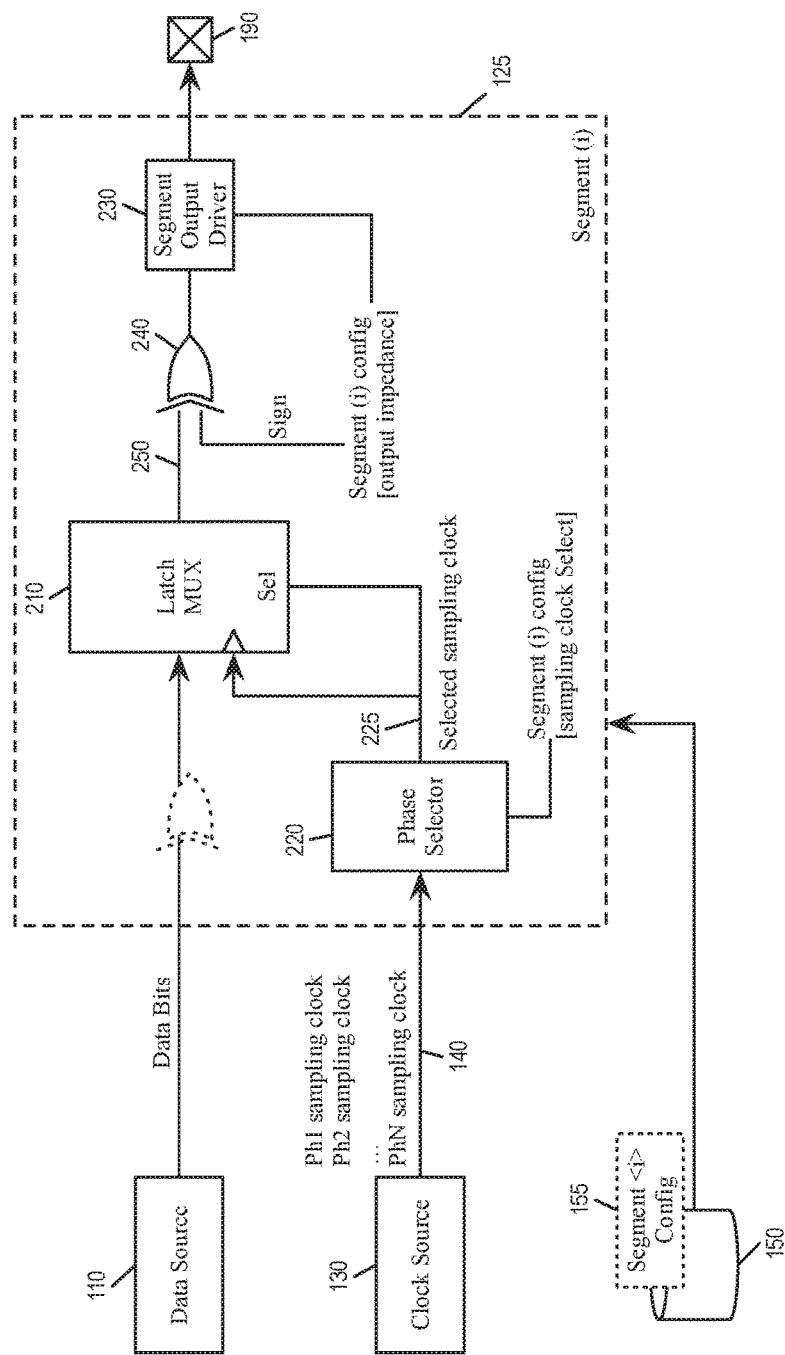
FIG. 2 illustrates a driver segment in greater detail, consistent with an exemplary embodiment of the invention.

FIG. 2 illustrates a driver segment in greater detail, consistent with an exemplary embodiment of the invention. The driver segment 125 is one of the driver segments 121-129 in the serial transmitter 100. The driver segments receives data bits from the data source 110 and the set of sampling clocks 140 from the clock source 130. The driver segment 125 serializes the received data bits based on the received clocks to drive a 1-bit segment output toward the serial output port 190.

As illustrated, the driver segment 125 has a latch-multiplexer 210, a phase selector 220, a segment output driver 230, and a sign inverter 240. Each of these components of the driver segment 125 is configured by the configuration data set 155 from the configuration data store 150.

The phase selector 220 selects one of the sampling clocks 140 (i.e., one of the N phases) as the selected sampling clock 225 (or as the selected phase of the sampling clock) to the latch-multiplexer 210. The selection is controlled by the configuration data set 155.

The latch-multiplexer 210 is implemented by a succession of storage elements and multiplexers to serialize the data bits from the data source 110. The latch-multiplexer 210 uses the selected sampling clock 225 to enable the storage elements (latches and/or flip-flops) to hold data bits and to select a held data bit as the segment output 250 of the driver segment 125. The latch-multiplexer 210 latches the input half-rate data on one edge of the sampling clock, and the sampled data stored in the latches are multiplexed according to the polarity of the sampling clock 225. An example implementation of the latch-multiplexer 210 will be described by reference to FIG. 8 below.

The segment output driver 230 drives the segment output 250 onto the serial output port 190 of the device 100. The strength of the output driver is specified by the segment configuration data 155. In some embodiments, the strength of the output driver is specified in terms of output impedance. The parallel combination of the impedances from all of the driver segments sets the output impedance of the driver (typically 50 ohm single-ended or 100 ohm differential). The impedances of each of the segments may vary by design for one of two reasons. First, in order to produce evenly spaced multi-level PAM signal at the serial output port 190 of the serial transmitter 100, a driver segment configured to transmit MSB data have an impedance that is half that of a driver segment configured to transmit LSB data. Second, the segment impedance influences the tap strength when implementing an FFE.

The sign inverter 240 (illustrated as an XOR gate) can be configured to invert the polarity of the segment output 250 by the segment configuration data 155, which is specified according to the FFE design. The configurable inversion allows the driver segment to implement a FFE tap with negative weight or strength. In the illustrated example as well as in some embodiments, the sign inverter 240 is for inverting the output the latch-multiplexer 210. In some embodiments, the sign inverter 240 may instead be positioned before the latch-multiplexer 210 to invert the incoming data bits from the data source.

Figure 3:
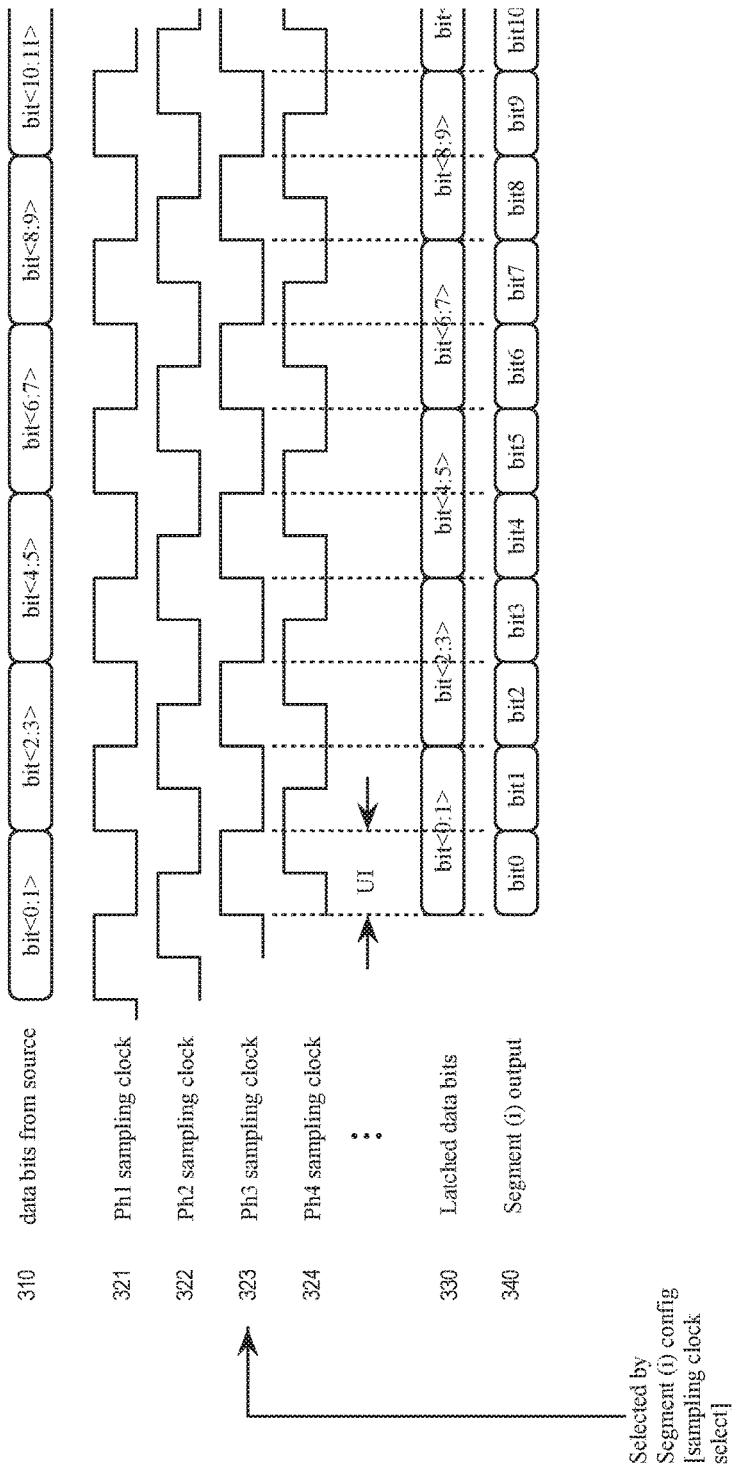
FIG. 3 illustrates the timing of the segment output based on the selected sampling clock, consistent with an exemplary embodiment.

FIG. 3 illustrates the timing of the segment output based on the selected sampling clock (or the selected phase of the sampling clock), consistent with an exemplary embodiment. For some embodiments, the figure illustrates the operations of the latch-multiplexer 210 by showing the timing relationships between the different phases of the sampling clock and the segment output of the driver segment 125.

The figure includes waveforms 321-324 that corresponds to the sampling clocks of different phases (140). The configuration of the driver segment selects phase 3 of the sampling clock (323) to clock in data bits from the data source 110 as the latched data bits 330. The polarity of the phase-3 sampling clock 323 is also used to multiplex between the two bits of the latched data bits 330 in order to produce the segment output 340. (For example, the driver segment outputs bit 0 as when the phase 3 sampling clock is high and bit 1 when the phase 3 sampling clock is low.) The sampling clock is therefore a half-rate clock (with respect to full symbol rate) with clock period of 2 UI. For simplicity, the timing diagram does not include latency through any serializer circuits. This latency would cause segment (i) output 340 to be delayed with respect to the latched data bits 330.

Figure 4:
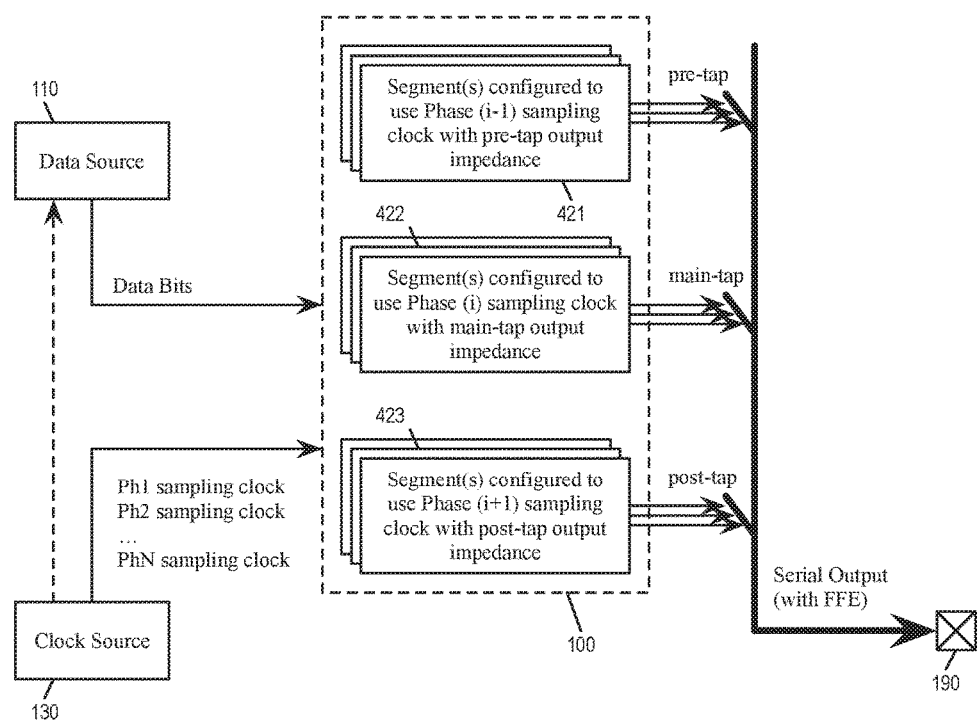
FIG. 4 illustrates the driver segments of the serial transmitter being configured to serve as FFE taps.

In some embodiments, the serial transmitter 100 is configured to provide FFE filtering for its output signal. Specifically, the segments of the serial transmitter are configured to use different phases of the sampling clock and different driver impedances in order to serve as different FFE taps. FIG. 4 illustrates the driver segments of the serial transmitter 110 being configured to serve as FFE taps. The figure illustrates three groups of driver segments 421, 422, and 423 that respectively correspond to the pre-cursor tap, the main-cursor tap, and the post-cursor tap of the FFE.

The driver segments in the group 421 are configured (by their configuration data) to serve as the pre-cursor tap in the FFE. Specifically, the outputs of the driver segments in the group 421 jointly drives the serial output port 190 of the serial transmitter with driver impedance that corresponds to the strength of the FFE pre-cursor tap. Likewise, the outputs of the driver segments in the group 422 jointly drive the serial output port 190 of the serial transmitter with output impedance that corresponds to the strength of the FFE main-cursor tap, and the outputs of the output segments in the group 423 jointly drive the serial output port 190 of the serial transmitter with output impedance that corresponds to the strength of the FFE post-cursor tap. In some embodiments, the serial transmitter has a collection of driver segments with differing output impedances. When configuring the driver segments to implement a particular FFE tap (e.g., pre-cursor, main-cursor, or post-cursor), a collection of driver segments that in parallel implement the required output impedance are identified and configured to implement that particular FFE tap.

In addition to having its output impedance configured to implement the strength (or weight) of the corresponding FFE tap, each driver segment is also configured to produce an output bit (segment output) every half sampling clock cycle according to the timing required by the corresponding FFE tap. Specifically, the data at the FFE post-cursor tap is a delayed version of the data at the FFE main-cursor tap, and the data at the FFE main-cursor tap is a delayed version of the data at the FFE pre-cursor tap. For the serial transmitter 100, the delay spacing between the FFE taps is implemented by having driver segments of different FFE taps configured to use different phases of the sampling clock.

Figure 5:
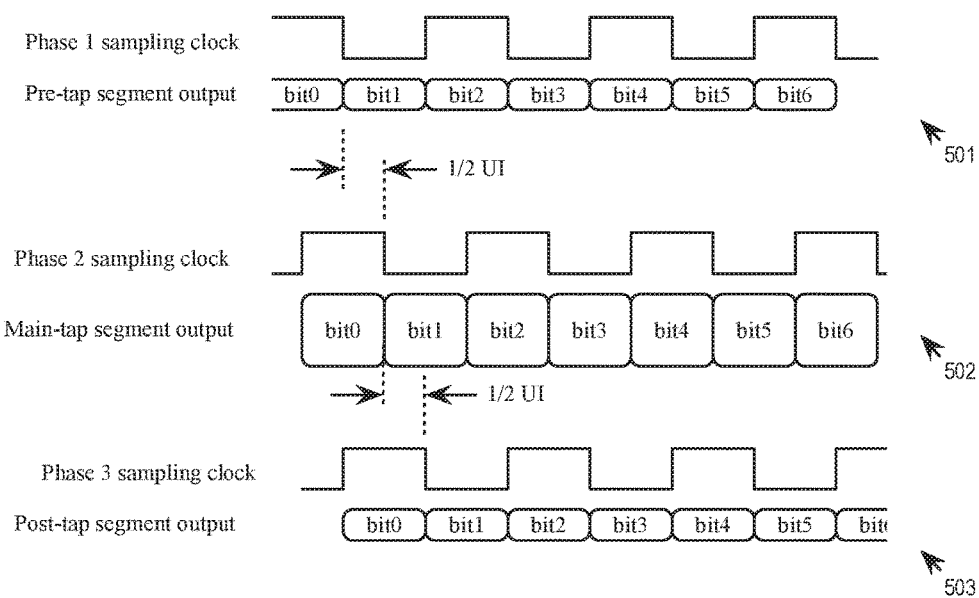
FIG. 5 illustrates the timing of segment outputs from driver segments that are configured to implement different FFE taps, consistent with an exemplary embodiment.

FIG. 5 illustrates the timing of segment outputs from driver segments that are configured to implement different FFE taps, consistent with an exemplary embodiment. The figure illustrates three sets of timing waveforms 501, 502, and 503. The waveforms 501 belongs to a FFE pre-cursor tap driver segment, the waveforms 502 belongs to a FFE main-cursor tap driver segment, and the waveforms 503 belongs to a FFE post-cursor tap driver segment. Each set of waveforms for a driver segment of a FFE tap shows the timing of the sampling clock selected for the driver segment, as well as the segment output of the driver segment.

As illustrated by waveforms 501, 502 and 503, the sampling clock selected for the pre-cursor tap driver segment is at an earlier phase than the sampling clock selected for the main-cursor tap driver segment, while the sampling clock selected for the post-cursor tap driver segment is at a later phase than the sampling clock selected for the main-cursor tap driver segment. Since the output data of each driver segment is multiplexed (i.e., selected) based on the polarity of the driver segment's sampling clock, the timing of the segment output is also determined by the phase of the driver segment's sampling clock. Consequently, the timing difference between the segment outputs at pre-cursor tap and main-cursor tap is the difference between their corresponding clock phases (likewise between main-cursor tap and post-cursor tap).

In the illustrated example as well as in some embodiments, the sampling clock has four different phases, so the timing difference between the pre-cursor tap and the main-cursor tap (and between the main-cursor tap and the post tap) is a quarter of the period of the sampling clock. And since the sampling clock is a half-rate clock with period of 2 UI, the temporal spacing between adjacent FFE taps is half UI.

As mentioned, the serial transmitter can be configured to produce a multi-level PAM signal that encodes multiple bits in each symbol. In these instances, each driver segment is configured to output and drive one bit for the encoded symbol. In the case of PAM4, each symbol encodes a MSB bit and a LSB bit, and some of the driver segments are configured to drive the MSB bit while some of the other driver segments are configured to drive the LSB bit.

Figure 6:
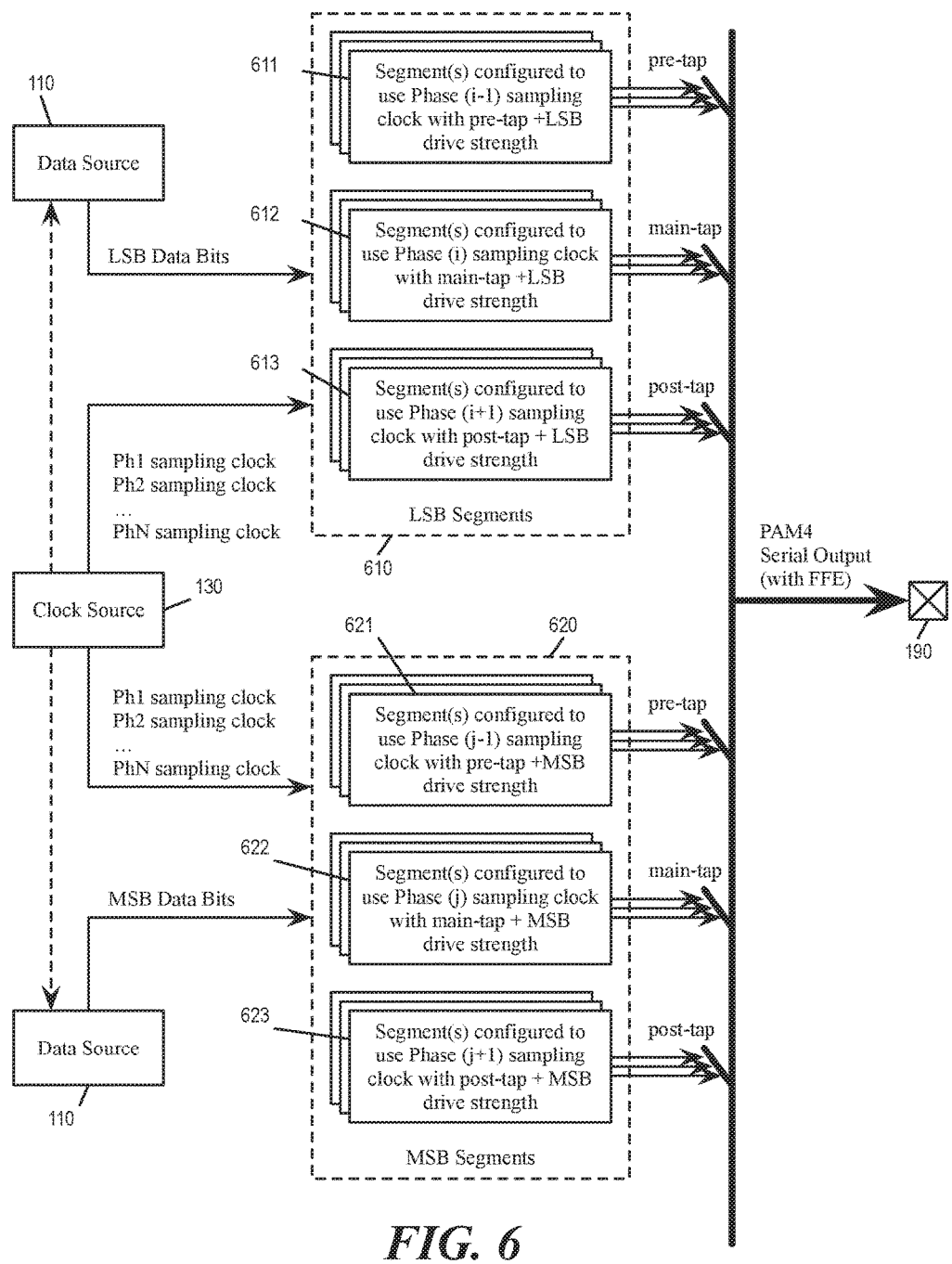
FIG. 6 illustrates the driver segments of the serial transmitter configured to drive PAM4 signals.

FIG. 6 illustrates the driver segments of the serial transmitter configured to drive PAM4 signals. The figure shows two sets of driver segments 610 and 620. The driver segments in the set 610 are configured to serialize data bits received from the data source 110 and drive the serialized data bits as the LSB of the PAM4 output, while the driver segments in the set 620 are configured to serialize data bits received from the data source 110 and drive the serialized data bits as the MSB of the PAM4 output. A driver segment configured to transmit MSB data has an output impedance that is half that of a driver segment configured to transmit LSB data. The LSB and MSB data may be encoded such that the resulting PAM4 output is Gray encoded (also known as the reflected binary code).

The PAM4 signal being transmitted by the serial transmitter 610 is also filtered by FFE. As illustrated in the figure, the LSB driver segments 610 include driver segments that are configured to implement the taps of the FFE (LSB pre-cursor tap segments 611, LSB main-cursor tap segments 612, and LSB post-cursor tap segments 613). Each set of driver segments is configured to have combined output impedance that correspond to the LSB of the PAM4 as well as to the strength of its corresponding FFE tap (pre-, main-, or post-cursor). Likewise, the MSB driver segments 620 include driver segments that are configured to implement the taps of the FFE (MSB pre-cursor tap segments 621, MSB main-cursor tap segments 622, and LSB post-cursor tap segments 623). Each set of driver segments is configured to have combined output impedance that correspond to the MSB of the PAM4 as well as to the strength of its corresponding FFE tap. Each driver segment is also configured to select and use a sampling clock at a phase that corresponds to its FFE tap (pre-, main, or post).

In the examples illustrated so far, the driver segments of the serial transmitter receive a set of half-rate clocks whose period is twice the unit interval (UI), and a set of half-rate data whose bit duration is twice the unit interval. In some embodiments, the driver segments also receive a set of quarter-rate clocks whose period is four times the unit interval, and a set of quarter-rate data whose bit duration is four times the unit interval. Each driver segment receives both half-rate clocks and quarter-rate clocks of different phases, and the configuration data selects one phase of the half-rate clock and one phase of the quarter rate clock for serializing and transmitting the data bits from the data source. The selected half-rate clock and the selected quarter-rate clock are both used to control a succession of storage and multiplexing operations for serialization. This allows the driver segment to receive 4 bits of quarter-rate data from the data source 110 once every quarter-rate clock cycle (rather than 2 bits of half-rate data from the data source 110 once every half-rate clock cycle as illustrated in FIG. 3).

Figure 7:
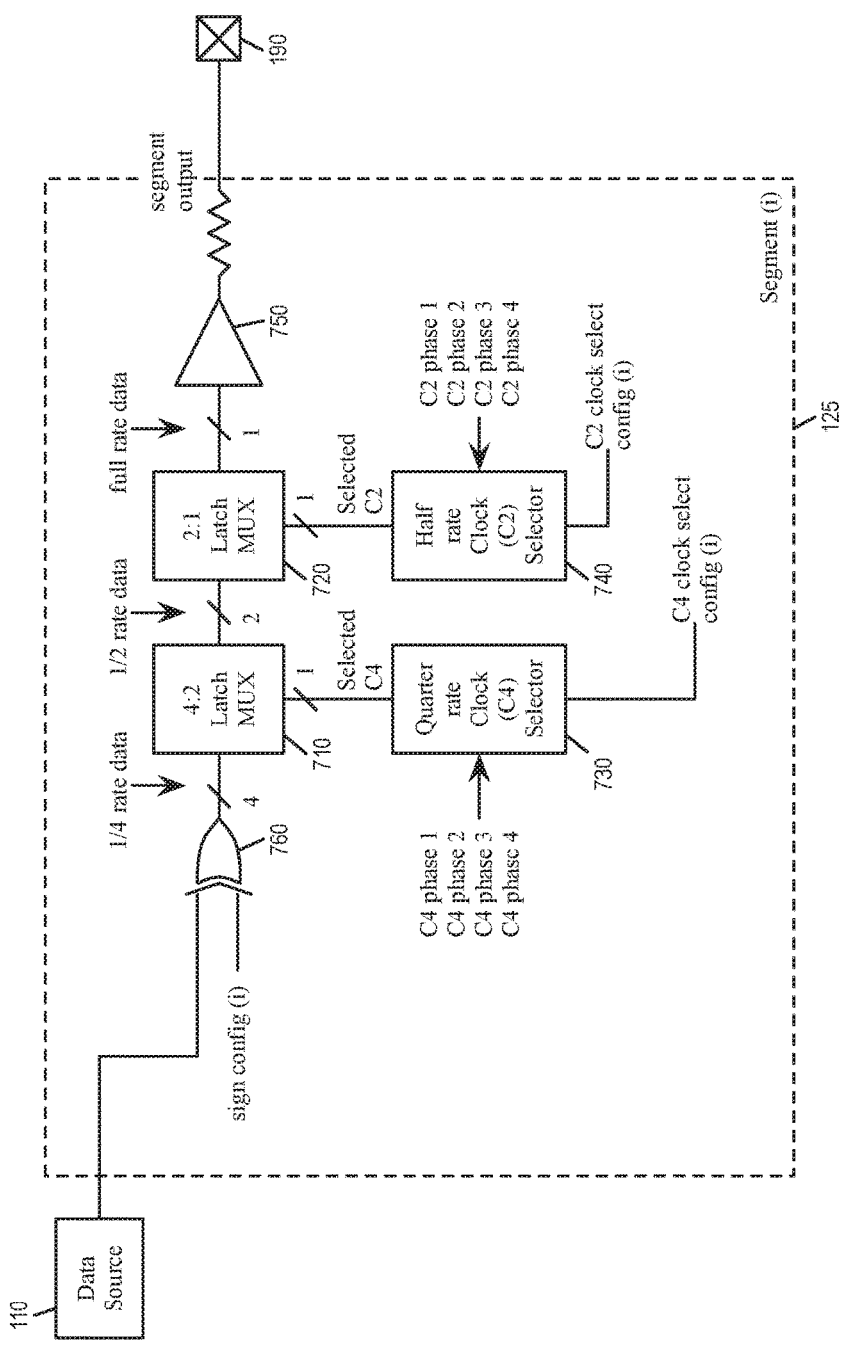
FIG. 7 illustrates the driver segment using both half-rate clock (C2) and quarter-rate clock (C4) for serializing data bits for transmission, consistent with an exemplary embodiment.

FIG. 7 illustrates the driver segment 125 using both half-rate clock (C2) and quarter-rate clock (C4) for serializing data bits for transmission, consistent with an exemplary embodiment. The clock source 130 generates the C4 clock by using a by dividing the C2 clock using a clock divider. The clock source 130 also generates 4 versions of the C2 clock at 4 quadrature phases and 4 versions of the C4 clock at 4 quadrature phases. The driver segment 125 receives the 4 versions the C2 clock and the 4 versions of the C4 clock, and the configuration data selects a C2 phase and a C4 phase for serializing the data bits from the data source 110. The driver segment 125 includes a 4:2 latch-multiplexer 710, a 2:1 latch-multiplexer 720, a C4 clock selector 730, a C2 clock selector 740, an output driver 750, and a sign inverter 760.

The C4 clock selector 730 is configured to select a C4 clock phase for operating the 4:2 latch-multiplexer 710 and the C2 clock selector 740 is configured to select a C2 clock phase for operating the 2:1 latch-multiplexer 720. An example implementation of the clock selector 740 will be described by reference to FIG. 8 below. The output driver 750 has preset output impedance. Different driver segments have different preset output impedances. When configuring the driver segments to implement a particular FFE tap (e.g., pre-cursor, main-cursor, or post-cursor) at a particular modulation amplitude in the multilevel PAM signal (e.g., MSB or LSB), a collection of driver segments that in parallel implement the required output impedance are identified and configured to implement that particular FFE tap and modulation amplitude.

The 4:2 latch-multiplexer 710 uses one edge of the selected C4 clock to sample quarter-rate data bits from the data source 110 (after the sign inverter 760), and alternating edges of (both rising and falling) of the selected C4 clock to generate half-rate serialized data bits for output to the 2:1 latch-multiplexer 720. The 2:1 latch-multiplexer 720 in turn uses one edge of the selected C2 clock to sample half-rate data from the 4:2 latch-multiplexer, and alternating edges (both rising and falling) of the selected C2 clock to generate full-rate serialized data for output to the segment output driver 750 and onto the serial output port 190.

Figure 8:
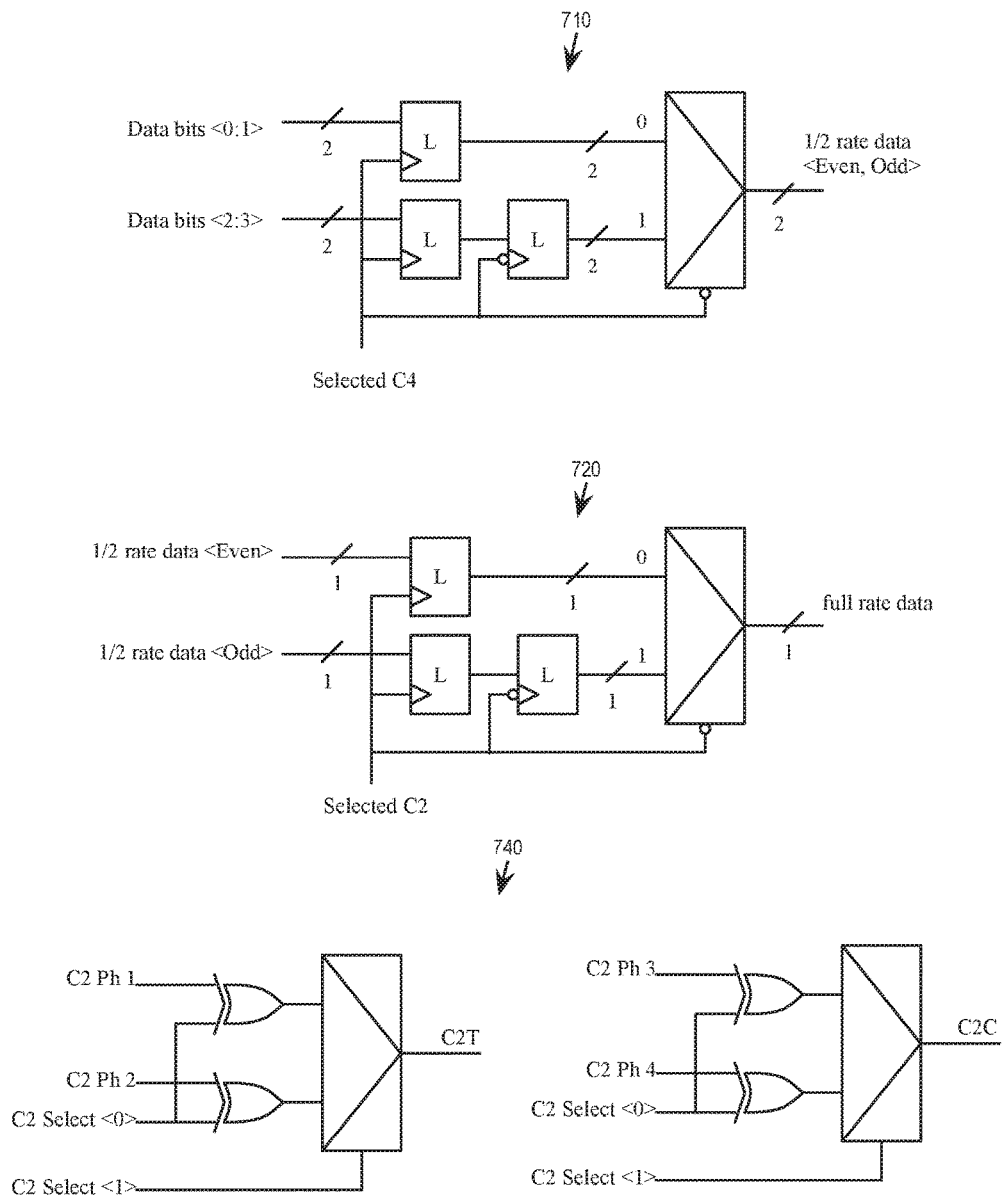
FIG. 8 illustrates example implementations of the 4:2 and 2:1 latch-multiplexers.

FIG. 8 illustrates example implementations of the 4:2 and 2:1 latch-multiplexers. The storage elements in the latch-multiplexers are latches that pass data when the clock input is at logic low and hold data when the clock input is at logic high. The 4:2 latch-multiplexer 710 latches 4 bits of data (data bits <0:3>) from the data source and chooses 2 of the bits based on the polarity of the selected C4 clock as half-rate data (bits <0:1> when C4 is high and bits<2:3> when C4 is low). The 2:1 latch-multiplexer 720 latches the chosen 2 bits of data from the 4:2 latch-multiplexer 720 (half-rate data <even, odd>) and chooses 1 of the latched bits based on the polarity of the selected C2 clock as full-rate data (<even> when C2 is high and <odd> when C2 is low).

FIG. 8 also illustrates an example implementation of a C2 clock phase selector. As illustrated, XOR gates at the input either pass or invert the input clocks depending of the polarity of the C2 Select <0> logic signal. A static select circuit chooses between phases 1 and 2 as well as between phases 3 and 4 based on the polarity of the C2 Select <1> logic signal. The outputs are true and complimentary C2 clock signals (C2T and C2C, respectively). A similar circuit could be used to select the C4 clock phase for the 4:2 MUX. Other circuits to achieve this functionality could be devised by one skilled in the art. The present invention is not dependent on a specific implementation of the phase selector circuit.

Figure 9:
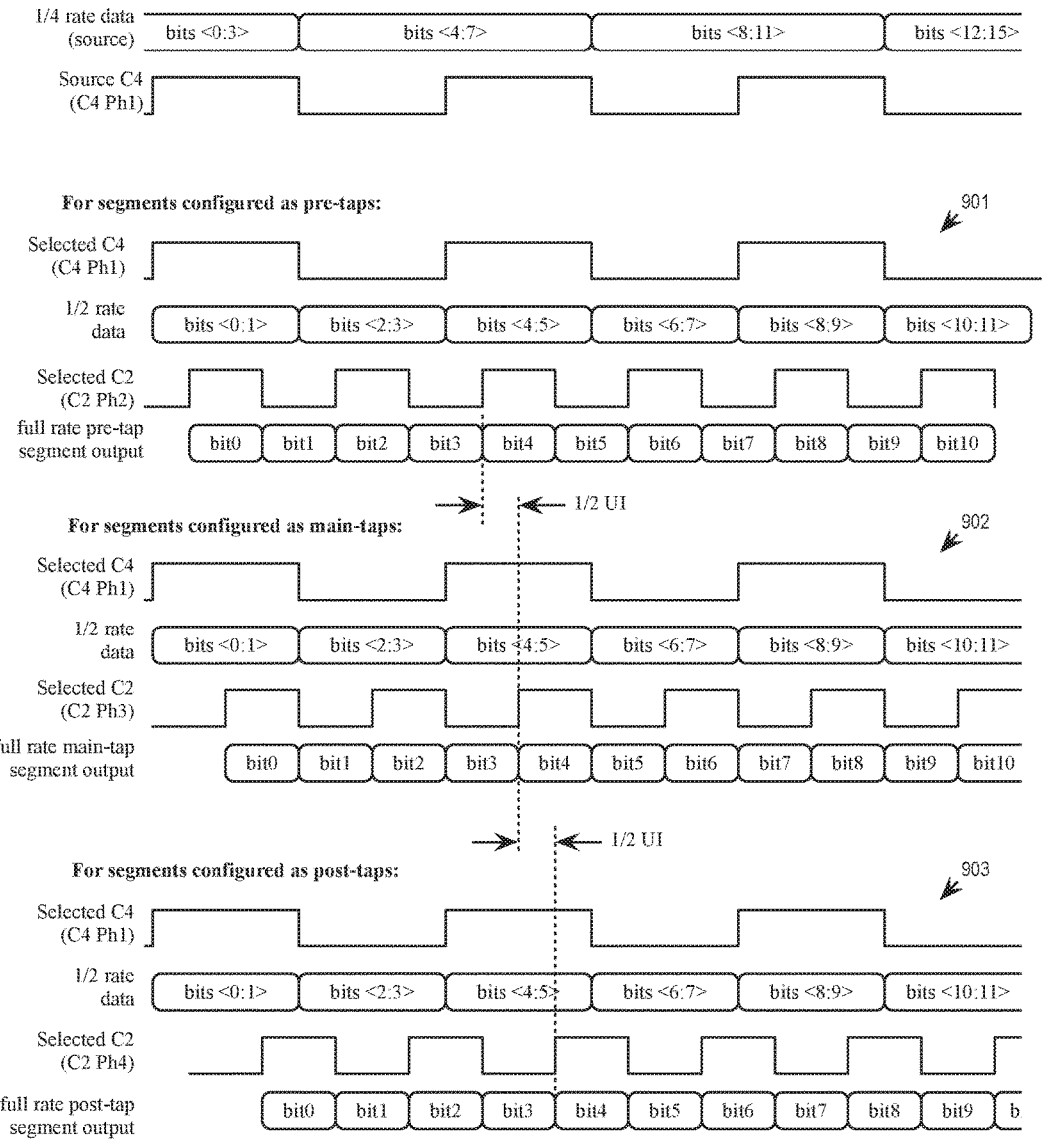
FIG. 9 illustrates the timing of driver segments that are configured to have FFE taps that are temporally separated by half UI, consistent with an exemplary embodiment

FIG. 9 illustrates the timing of driver segments that use different phases of C2 and C4 for latching and multiplexing data. Specifically, the figure compares the timing of driver segments that are configured as half-UI spaced FFE taps. The figure includes waveform sets 901, 902, and 903 for showing the timing of the latching and multiplexing operations of pre-cursor tap, main-cursor tap, and post-cursor tap driver segments, respectively.

As illustrated, the data source provides 4 bits of data every C4 clock cycle. The pre-cursor tap, main-cursor tap, and post-cursor tap driver segments all use C4 of phase 1 to latch and multiplex the 4 bit source into 2-bit half-rate data. For clarity in the timing diagram, latency through the 4:2 latch-multiplexer is not shown. This latency would arise, for example, due to the storing of quarter-rate data in latches in the 4:2 latch-multiplexer 710 prior to selection of the quarter-rate data by the multiplexer to generate serialized half-rate data. The pre-cursor tap, main-cursor tap, or post-cursor tap driver segments use different C2 phases to latch and multiplex the 2-bit half-rate data into one bit full-rate data. Specifically the pre-cursor tap driver segment uses C2 phase 2, the main-cursor tap driver segment uses C2 phase 3, and the post-cursor tap driver segment uses C2 phase 4. Since the C2 clock is a half-rate clock whose quadrature phases are spaced half UI apart, the full rate data produced by the driver segments of adjacent FFE taps are also spaced half UI apart, i.e., the pre-cursor tap segment output is half-UI ahead of the main-cursor tap segment output, and the main-cursor tap segment output is half-UI ahead of post-cursor tap segment output. In other words, driver segments respectively configured as pre-cursor tap, main-cursor tap, and post-cursor tap of the FFE sample a particular bit from the data source and output the particular bit at three different time instants, where the three time instants corresponds to three consecutive phases of the half-rate clock. For clarity in the timing diagram, latency through the 2:1 latch-multiplexers in the pre-, main-, and post-cursor tap segments is not shown. This latency would arise, for example, due to the storing of half-rate data in latches in the 2:1 latch-multiplexer 720 prior to selection of the half-rate data by the multiplexer to generate serialized full-rate data.

The driver segments of FIG. 9 are configured to have FFE taps that are temporally separated by half-UI. However, the driver segments can also be configured to have FFE taps with one-UI spacing. This is accomplished by configuring driver segments of different taps to use different C4 quadrature phases to sample data from the data source.

Figure 10:
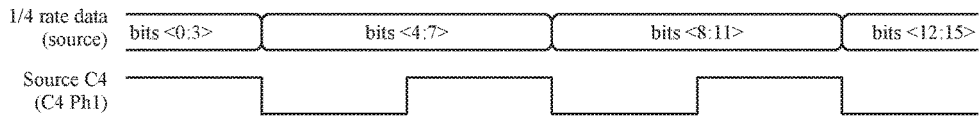
FIG. 10 illustrates the timing of driver segments that are configured to have FFE taps that are temporally separated by one UI, consistent with an exemplary embodiment.
Figure 10:
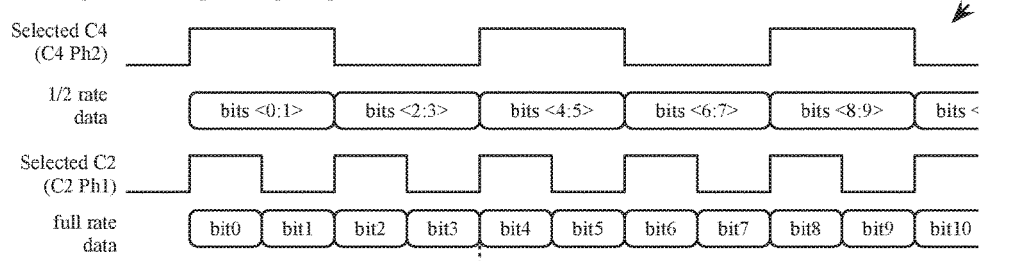
Figure 10:
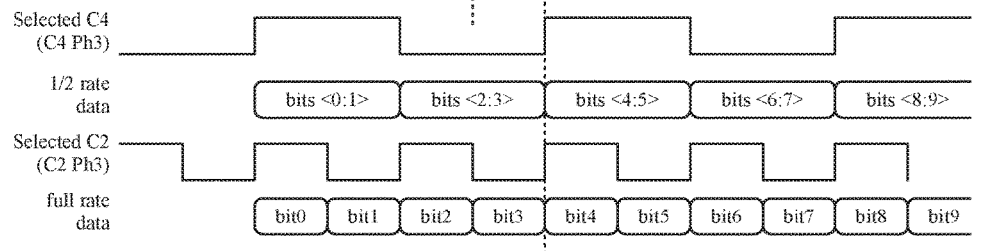
Figure 10:
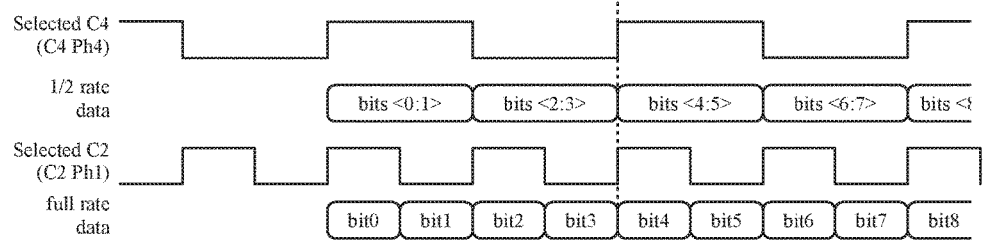

FIG. 10 illustrates the timing of driver segments that are configured such that the FFE has taps that are temporally separated by one UI. Waveform sets 1001, 1002, and 1003 show the timing of the latching and multiplexing operations of driver segments that are configured as pre-cursor tap, main-cursor tap, and post-cursor tap, respectively.

As illustrated, the data source provides 4 bits of quarter-rate data every C4 clock cycle, with a bit duration of four times the unit interval of the transmitter output data. However, the pre-cursor tap, main-cursor tap, and post-cursor tap driver segments are configured to use different C4 phases to latch and multiplex 4 bit quarter-rate data into two-bit half-rate data: the pre-cursor tap driver segment captures the quarter-rate data using C4 phase 2 and in turn generates half-rate data on alternating edges (both rising and falling) of C4 phase 2, the main-cursor tap driver segment captures the quarter-rate data using C4 phase 3 and in turn generates half-rate data on alternating edges (both rising and falling) of C4 phase 3, and the post-cursor tap driver segment captures the quarter-rate data using C4 phase 4 and in turn generates half-rate data on alternating edges (both rising and falling) of C4 phase 4. Since the C4 clock is a quarter-rate clock whose quadrature phases are temporally separated by one UI, the half-rate data of the different FFE taps are also temporally separated by one UI. Specifically, the half-rate data of the pre-cursor tap driver segment is one UI ahead of the half-rate data of the main-cursor tap driver segment, and the half-rate data of the main-cursor tap driver segment is one UI ahead of the half-rate data of the post-cursor tap driver segment. For clarity in the timing diagram, latency through the 4:2 latch-multiplexers in the pre-, main-, and post-cursor tap segments is not shown. This latency would arise, for example, due to the storing of quarter-rate data in latches in the 4:2 latch-multiplexer 710 prior to selection of the quarter-rate data by the multiplexer to generate serialized half-rate data. The 4:2 latch-multiplexers in the pre-, main-, and post-cursor driver segments would all experience the same latency relative to their respective C4 clock edges. Consequently, the latency would not affect the one UI temporal spacing of the half-rate data.

The pre-cursor tap segment and the post tap segment are both configured to latch and multiplex their respective half-rate data by using phase 1 of the C2 clock, while the main-cursor tap segment is configured to latch and multiplex its half-rate data by using phase 3 of the C2 clock (180-degrees, or one UI away). Consequently, the full-rate segment outputs of the pre-, main- and post-taps are each separated by two C2 phases from their neighboring taps, i.e., the pre-cursor tap segment output is one UI ahead of the main-cursor tap segment output, and the main-cursor tap segment output is one UI ahead of post-cursor tap segment output.

Figure 11:
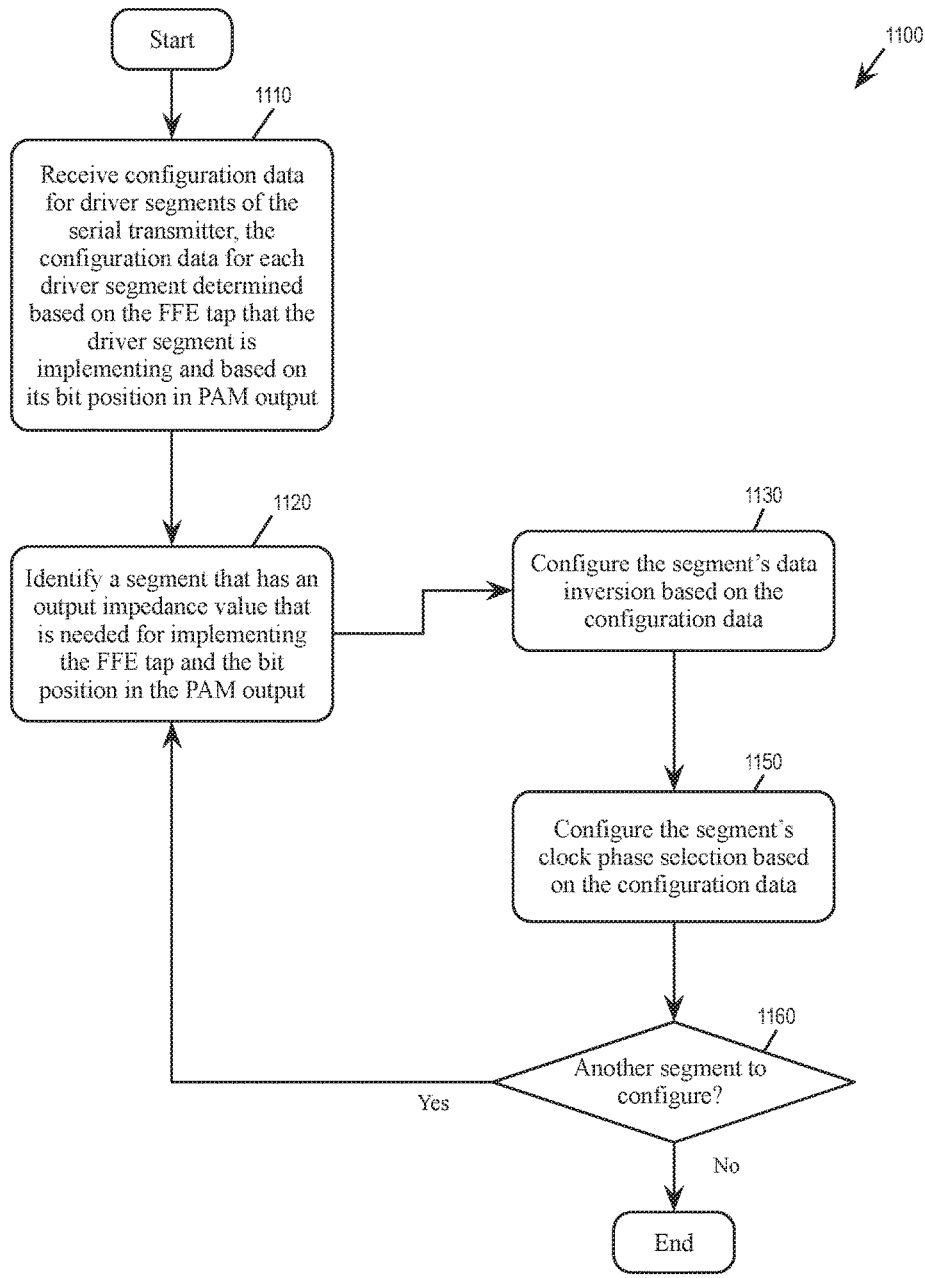
FIG. 11 conceptually illustrates a process for configuring the driver segments of the serial transmitter, consistent with an exemplary embodiment.

FIG. 11 conceptually illustrates a process 1100 for configuring the driver segments of the serial transmitter (e.g., 100), consistent with an exemplary embodiment. In some embodiments, one or more processing units (e.g., a processor) of a computing device controlling the serial transmitter perform the process 1100. In some embodiments, one or more processing units (e.g., a processor) embedded in an IC that also includes the serial transmitter perform the process 1100.

The processor starts the process 1100 when it receives (1110) configuration data for configuring driver segments of the serial transmitter. The configuration data for each driver segment is determined based on the FFE tap that the segment is implementing as well as the segment's modulation amplitude in the encoded multi-level serial output (e.g., MSB or LSB in a PAM4 symbol). The process then identifies (1120) a driver segment to configure. Specifically, the process determines the output impedance that is needed to implement the FFE tap strength and the modulation amplitude in the PAM output and identifies a driver segment that has an output impedance value that is needed to implement the FFE tap and the modulation amplitude in the PAM output.

The processor configures (at 1130) the identified driver segment's data inversion logic (e.g., the XOR gate 240 or 760). This allows the driver segment to implement a FFE tap with negative strength. The processor also configures (at 1150) the driver segment's clock phase selection based on the configuration data. In some embodiments, each driver segment receives half-rate clocks and quarter-rate clocks at quadrature phases. The selection of the phase of the half-rate clock and the selection of the phase of the quarter-rate clock are determined based on the FFE tap that the segment is implementing (i.e., whether pre-, main-, or post-cursor), and also based on whether the spacing between FFE taps (e.g., one-UI, half-UI, or other fraction UI). The selection of the clock phase for driver segments of different FFE taps is described by reference to FIG. 9 and FIG. 10 above.

The processor then determines (at 1160) whether there is another driver segment to configure. If so, the processor 1100 returns to 1120 to identify and configure another driver segment. If not, the process 1100 ends.

Calibration

Achieving sufficient timing margin in a high-speed serial transmitter is not trivial, particularly when configuring the FFE to provide half-UI spaced delays. Critical delays can degrade the timing margin of the half-UI spaced FFE, for example, when sampling the half-rate data at the input to the 2:1 latch-multiplexer (e.g., 720 of FIG. 7) of a driver segment. In the clock source, divider delay associated with generation of the C4 clocks would delay the C4 clock edges with respect the C2 clock edges by an amount $T_{C4DIV}$. Additionally, there is a finite clock-to-Q delay at the 4:2 latch-multiplexer (e.g., 710 of FIG. 7) by an amount $T_{CLK-Q,42}$ within the driver segment. Both $T_{C4DIV}$ and $T_{CLK-Q,42}$ would delay the half-rate data out of the 4:2 latch-multiplexer. Furthermore, there is a setup time requirement $T_{setup,21}$ at the 2:1 latch-multiplexer. $T_{C4DIV}$, $T_{CLK-Q,42}$, and $T_{setup,21}$ together affect the timing margin for reliable C2 sampling of the half-rate data at the 2:1 latch-multiplexer, particularly for a driver segment configured to serve the pre-cursor tap of the FFE. In addition, the values of $T_{C4DIV}$, $T_{CLK-Q,42}$, and $T_{setup,21}$ will vary according to the process corners in a semiconductor manufacturing process. Selection of a set of C2 clock phases for pre-, main-, and post-cursor taps may function in some process corners. However, selection of the same set of C2 clock phase may result in FFE failure due to timing violations in other process corners where the values of $T_{C4DIV}$, $T_{CLK-Q,42}$, and $T_{setup,21}$ are larger.

Figure 12A:
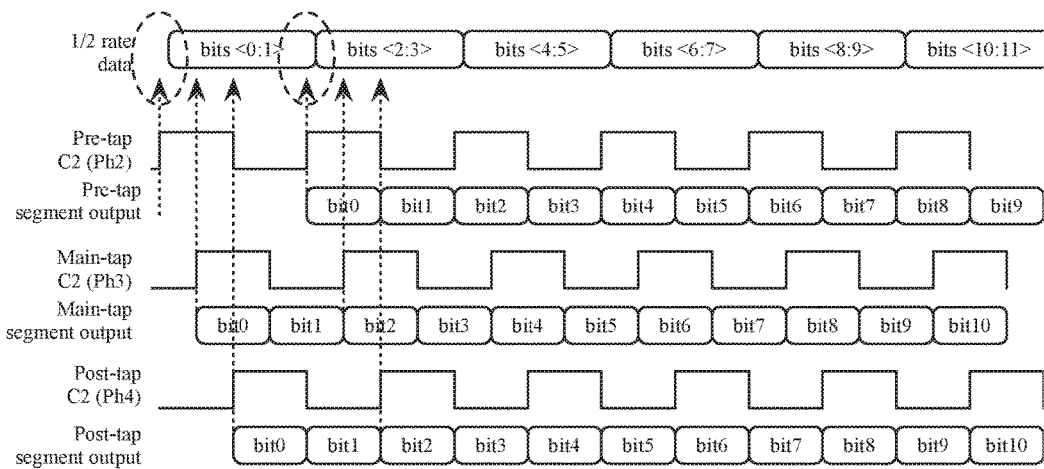
FIG. 12a illustrates FFE failure due to timing violations, consistent with an exemplary embodiment.

FIG. 12a illustrates FFE failure due to timing violations. The figure shows the half rate data arriving late (due to e.g., $T_{C4DIV}$ and $T_{CLK-Q,42}$) and missing the set up time requirement of the 2:1 latch-multiplexer for some clock phases of the C2 clock. For clarity, latency through the 2:1 latch-multiplexer is not shown in the timing illustration. This latency would delay all pre-, main, and post-cursor tap segment outputs equally, but would not impact the failure mechanism described below.

As illustrated, for latching the half-rate data, a pre-cursor tap driver segment is configured to use phase 2 of the C2 clock, a main-cursor tap driver segment is configured to use phase 3 of the C2 clock, and a post-cursor tap driver segment is configured to use phase 4 of the C2 clock. With the late arrival of the half-rate data, the main-cursor tap driver segment and the post-cursor tap driver segment still has sufficient timing margin to sample the correct data. However, the pre-cursor tap driver segment at phase 2 of the C2 clock samples too early relative to the half-rate data transition and may latch in incorrect data (indicated by the dashed circle) as segment output. With the pre-cursor tap driver segment producing incorrect data for the FFE pre-cursor tap, the FFE cannot function correctly.

Figure 12B:
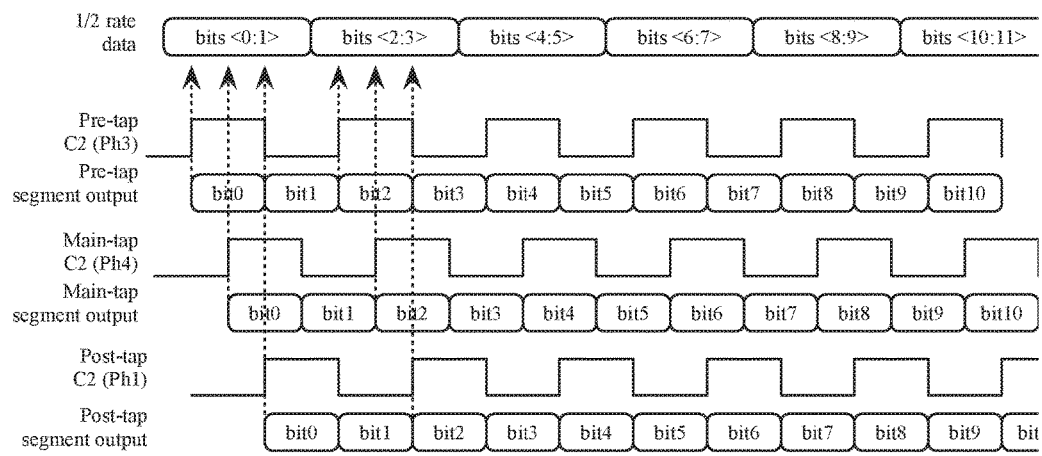
FIG. 12b illustrates using different clock phases to avoid timing violations, consistent with an exemplary embodiment.

FIG. 12b illustrates using different clock phases to avoid timing violations. Again for clarity, latency through the 2:1 latch-multiplexer is not shown in the timing illustration. This latency would delay all pre-, main-, and post-cursor tap segment outputs equally, but would not impact the proper sampling of the half-rate data at the input to the 2:1 latch-multiplexer. The figure shows the driver segments of the serial transmitter being reconfigured to use later C2 clock phases in order to overcome the setup time violations. Specifically, the pre-cursor tap driver segment is reconfigured to use phase 3 of the C2 clock, the main-cursor tap driver segment is reconfigured to use phase 4 of the C2 clock, and the post-cursor tap driver segment is reconfigured to use phase 1 of the C2 clock. Thus, though the timing of the half-rate data remains the same as in FIG. 12a, the reconfigured pre-cursor tap driver segment now has enough timing margin to satisfy setup time at its 2:1 latch-multiplexer. With pre-cursor tap, main-cursor tap, and post-cursor tap driver segments all satisfying timing requirement, the FFE of the serial transmitter has the correct data to function correctly.

In some embodiments, the serial transmitter is equipped with a timing error detection circuit for calibrating the selection of clock phases at driver segments. The timing error detection circuit detects and reports timing errors when the C2 clock phases selected for the driver segments serving as FFE taps do not provide sufficient timing margin relative to half-rate data transitions. Based on the reported timing error, new configuration data is generated to reconfigure the driver segments to select different clock phases for use in the pre-, main-, and post-cursor taps.

Figure 13:
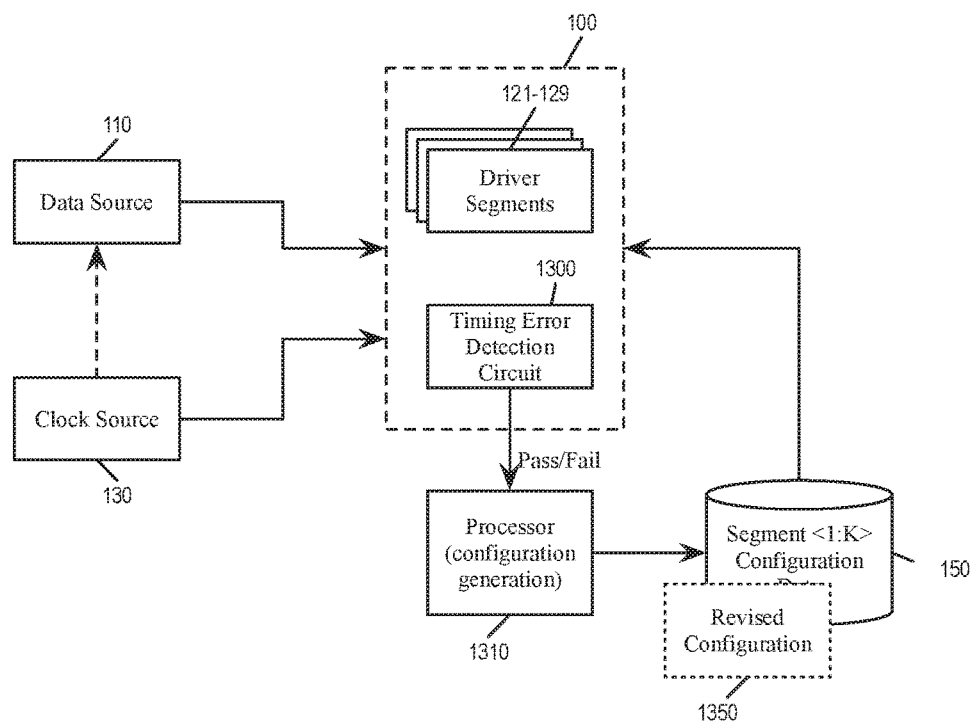
FIG. 13 illustrates the calibration of the driver segments of the serial transmitter, consistent with an exemplary embodiment.

FIG. 13 illustrates the calibration of the driver segments of the serial transmitter 100. The serial transmitter 100 has a timing error detection circuit 1300 for detecting timing errors and providing a timing error indication (pass/fail). A processor 1310 controlling the serial transmitter 100 uses the pass/fail indication to generate a revised set of configuration data 1350. The revised set of configuration data 1350 configures the driver segments 121-129 to select and use a different (e.g., later) set of phases of the C2 clock in order to eliminate setup time violations as illustrated in FIG. 12b above.

The processor 1310 can be in a computing device that controls the operation of the serial transmitter 100 or an embedded processor in the same IC or electronic device as the serial transmitter 100. In some embodiments, the processor 1310 reconfigures the driver segments by performing a process 1700, which will be described by reference to FIG. 17 below. The generated revised set of configuration data 1350 is stored in the configuration data store 150.

As mentioned, a timing error occurs when driver segments of two adjacent FFE taps (e.g., pre- and main or main and post-cursor) sample half-rate data at different sides of a data transition due to insufficient timing margin. The timing error detector circuit therefore compares data latched by sampling clocks of different phases to determine whether there is timing error. In some embodiments, the timing error detector circuit detects timing errors by (i) comparing data latched by sampling clocks of different phases, (ii) computing, via low-pass filtering, a voltage corresponding to the average value of the data comparison, and (iii) comparing this average difference voltage with a reference voltage to see if the average difference voltage is greater than a threshold as to indicate a timing error.

Figure 14:
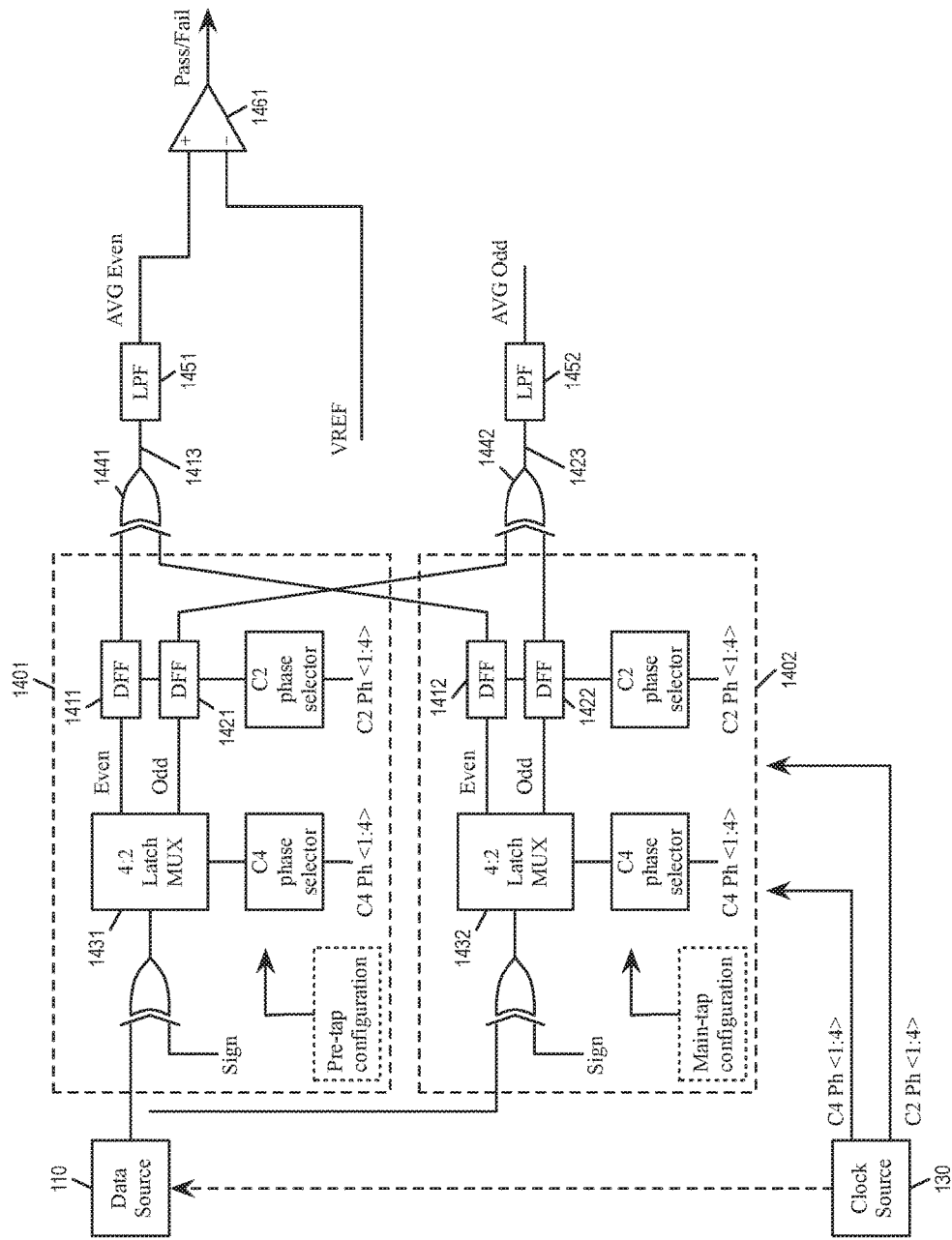
FIG. 14 illustrates a timing error detection circuit that detects timing errors by comparing data sampled at different clock phases, consistent with an exemplary embodiment.

FIG. 14 illustrates a timing error detection circuit 1400 that detects timing errors by comparing data sampled at different clock phases. As illustrated, the timing error detection circuit comprises two replicas 1401 and 1402 of the driver segments. Each replica driver segment is identical to the driver segments 121-129, except there is no C2 driven 2:1 latch-multiplexers. Instead, there is a set of delay flip-flops (DFFs) that are driven by the C2 clock of the selected phase acting as a sampler of data. In some embodiments, these DFFs can be implemented using two latches configured in a master-slave configuration. If the master latch is identical to the latch used to capture data in the 2:1 latch-multiplexer 720, then the setup time of this DFF will be equal to the setup time of the 2:1 latch-multiplexer $T_{setup,21}$. The replica 1401 is configured to select the same C2 and C4 phases as the driver segments that are configured as pre-cursor taps, while the replica 1402 is configured to select the same C2 and C4 phases as the driver segments that are configured as main-cursor taps.

A DFF 1411 in the replica 1401 latches the even bit of the half-rate data from the 4:2 latch-multiplexer 1431 on the selected C2 clock phase for a first FFE tap, while a DFF 1412 in the replica 1402 latches the odd bit of the half-rate data from the 4:2 latch-multiplexer 1432 on the selected C2 clock phase for a second FFE tap. In the example illustrated in FIG. 14, the first FFE tap is pre-cursor tap and the second FFE tap is main-cursor tap so the timing error detection circuit is configured to report timing error when the pre-cursor tap and the main-cursor tap are inconsistent. One of ordinary skill would understand that the timing error detection circuit may also be configured to detect timing error by latching data at clock phases for other adjacent pairs of FFE taps (e.g., for main-cursor tap and post-cursor tap).

A comparator (XOR gate) 1441 compares the output of the DFFs 1411 and 1412 to generate a difference signal 1413. A low pass filter (LPF) 1451 filters (by e.g., averaging) the difference signal 1413 to generate an average difference voltage (AVG even). An analog comparator 1461 compares the average difference voltage with a reference voltage (VREF) to determine whether the average difference between the data sampled at the pre-cursor tap clock phase (from the DFF 1411) and the data sampled at the main-cursor tap clock phase (from the DFF 1412) is too great as to indicate timing error.

In some embodiments as well as in the illustrated example, the replicas 1401 and 1402 can be used to detect timing errors by comparing either even bit or odd bit from the half-rate data. The replica 1401 has another DFF 1421 for latching the odd bit at the rising edge of the pre-cursor tap C2 phase and the replica 1402 has another DFF 1422 for latching the odd bit at the rising edge of the main-cursor tap C2 phase. The outputs of the DFF 1421 and 1422 are then compared by comparator 1442 to generate a difference signal 1423, which is then low-pass filtered by LPF 1452 to create an average difference voltage (AVG odd). This odd bit version of the average difference voltage can be compared with the reference voltage (VREF) to detect timing error as well.

Figure 15A:
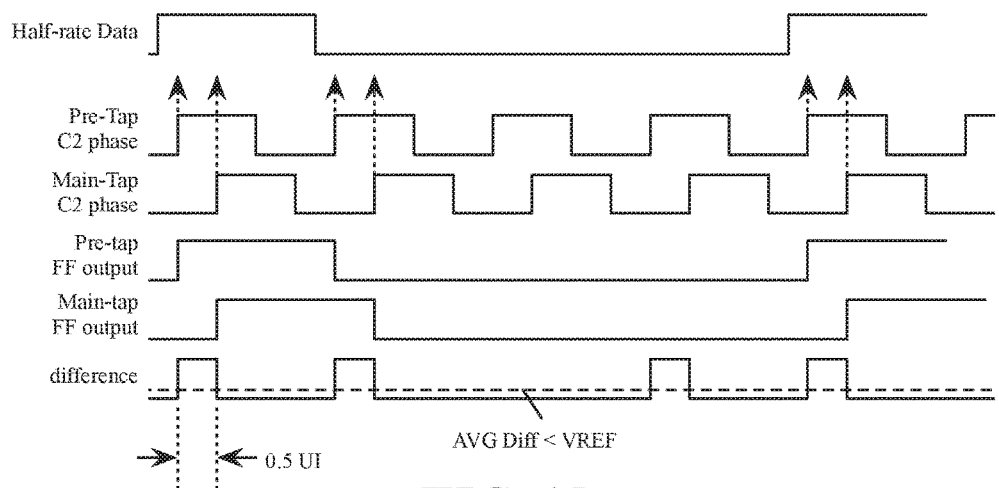
FIG. 15a and FIG. 15b illustrates the detection of timing error by comparing the average differential voltage with the reference voltage, consistent with an exemplary embodiment.
Figure 15B:
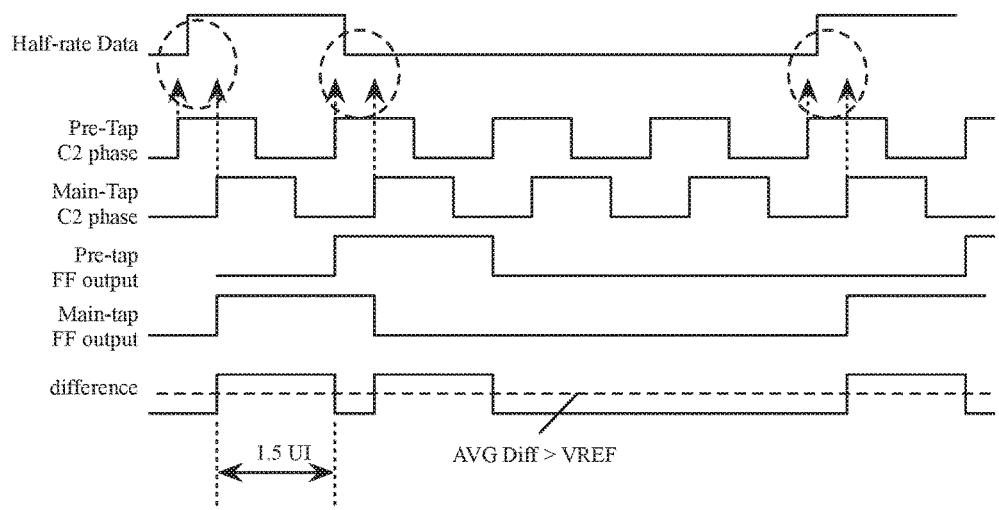

FIG. 15a and FIG. 15b illustrates the detection of timing error by comparing the average difference voltage with the reference voltage. FIG. 15a illustrates a scenario in which there is no timing error so that the average difference voltage is below the reference voltage. As illustrated, the rising edge of the pre-cursor tap C2 and the rising edge of the main-cursor tap C2 are both safely on the same side of a transition of the half-rate data. Consequently, the difference between the output of the pre-cursor tap DFF (1411) and the main-cursor tap DFF (1412) shows only a 0.5-UI pulse at each half-rate data transition. The average difference voltage is therefore likely to be lower than the reference voltage.

FIG. 15b illustrates a scenario in which there is a timing error so that the average difference voltage is greater than the reference voltage. As illustrated, the rising edge of the pre-cursor tap C2 and the rising edge of the main-cursor tap C2 fall on the different sides of a transition of half-rate data (because the arrival of the half-rate data fail to meet setup requirement with respect to the C2 clock phase chosen for the pre-cursor tap.) Consequently, the difference between the output of the pre-cursor tap DFF (1411) and the main-cursor tap DFF (1412) shows a 1.5-UI pulse at each half-rate data transition. The average difference voltage is therefore likely to be higher than the reference voltage.

Assuming 50% transition density, the average difference voltage will be $V_{DD}/8$ if the timing is clean (no setup time error with respect to the chosen clock phases), and $3V_{DD}/8$ if timing errors occur. In some embodiments, a reference voltage of $V_{DD}/4$ is therefore used to distinguish average difference voltage with timing errors from average difference voltage without timing errors. In some embodiments, during a start-up calibration procedure, the data may come from a different data source than 110. This data can be configured to ensure 50% transition density. An example of such a 50% transition density data source is a pseudo-random binary sequence (PRBS) pattern.

Figure 16:
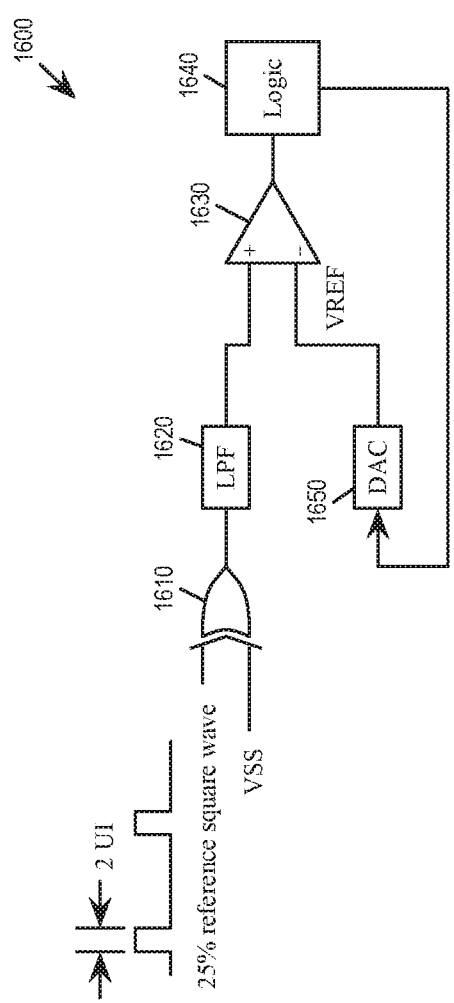
FIG. 16 illustrates an example circuit for generating the reference voltage.

In some embodiments, a reference voltage generation circuit generates the reference voltage based on a reference signal of a particular duty cycle. FIG. 16 illustrates an example circuit 1600 for generating the reference voltage. As illustrated, a 25% duty cycle square wave running at the half-rate data speed (i.e., high for 2UI, low for 6UI) is applied to one input of a XOR gate 1610. In some embodiments, an on-chip programmable pattern generator generates the square waveform. VSS is applied to the other input, such that the output of the XOR gate will also be a 25% duty cycle square wave. The XOR output is low-pass filtered by a LPF 1620 to obtain the average voltage of the square wave.

In some embodiments, the duty cycle is determined based on FFE tap spacing or spacing between the sampling clock phases. For sampling clock having N phases and adjacent FFE taps implemented at consecutive sampling clock phases, the duty cycle is 1/N. For N=4, the duty cycle is 25% and the FFE is a half-UI spaced FFE. For N=8, the duty cycle would be 12.5% and the FFE is a quarter-UI spaced FFE.

In an ideal case, the average voltage of the 25% duty cycle square wave is $V_{DD}/4$. This is the target reference voltage to discern clean timing and bad timing conditions when the data being transmitted has 50% transition density. However, finite bandwidth in XOR gate 1610 will cause the computed average voltage at the output of the XOR gate to be less than $V_{DD}/4$. For accurate calibration, the target reference voltage to discern clean timing and bad timing should be adjusted to match the computed average voltage at the XOR gate 1610 output. An analog comparator 1630 compares this average voltage against a programmable reference voltage VREF that is generated by a digital to analog converter (DAC) 1650. The output of the analog comparator 1630 is fed to a logic state machine 1640 to control the digital input to the DAC 1650. For example, if the output of the comparator 1630 is logic '1' and the output of the LPF 1620 is above VREF, then the digital DAC code is too low and will be incremented by the logic state machine 1640. On the other hand, if the output of the comparator 1630 is logic '0' and the output of the LPF 1620 is below VREF, then the digital DAC code is too high and will be decremented by the logic state machine 1640. In some embodiments, the logic state machine 1640 may take multiple readings of the output of comparator 1630 before incrementing or decrementing the DAC code. Once converged, the DAC 1650 will produce a VREF that is close to the average voltage produced by the output of the LPF 1620 (within the quantization levels of the DAC). The DAC 1650 and the corresponding calibrated VREF would then serve as the reference voltage for comparison against the average difference voltage (AVG even or AVG odd) at the analog comparator 1461 of FIG. 14.

To generalize, the calibration operation is for a serial transmitter that receives and serializes binary data from a data source (e.g., the quarter rate data from the data source 110 or the half-rate data from the 4:2 latch-multiplexer 710) by using different phases of a sampling clock (e.g., the half-rate clock C2) having N different phases (e.g., the quadrature phases of C2 clock) to implement different FFE taps (pre-cursor tap, main-cursor tap, and post-cursor tap).

The calibration operation compares data sampled by a first phase of the sampling clock with data sampled by a second phase of the sampling clock to create a difference signal. The calibration operation then low pass filters the difference signal to generate an average difference voltage and compares the average difference voltage with a reference voltage to determine whether the data source satisfies setup time with respect to the first phase of the sampling clock. The reference voltage is determined by low pass filtering a square wave whose duty cycle is determined by the desired FFE tap spacing and the expected transition density in the source binary data.

Figure 17:
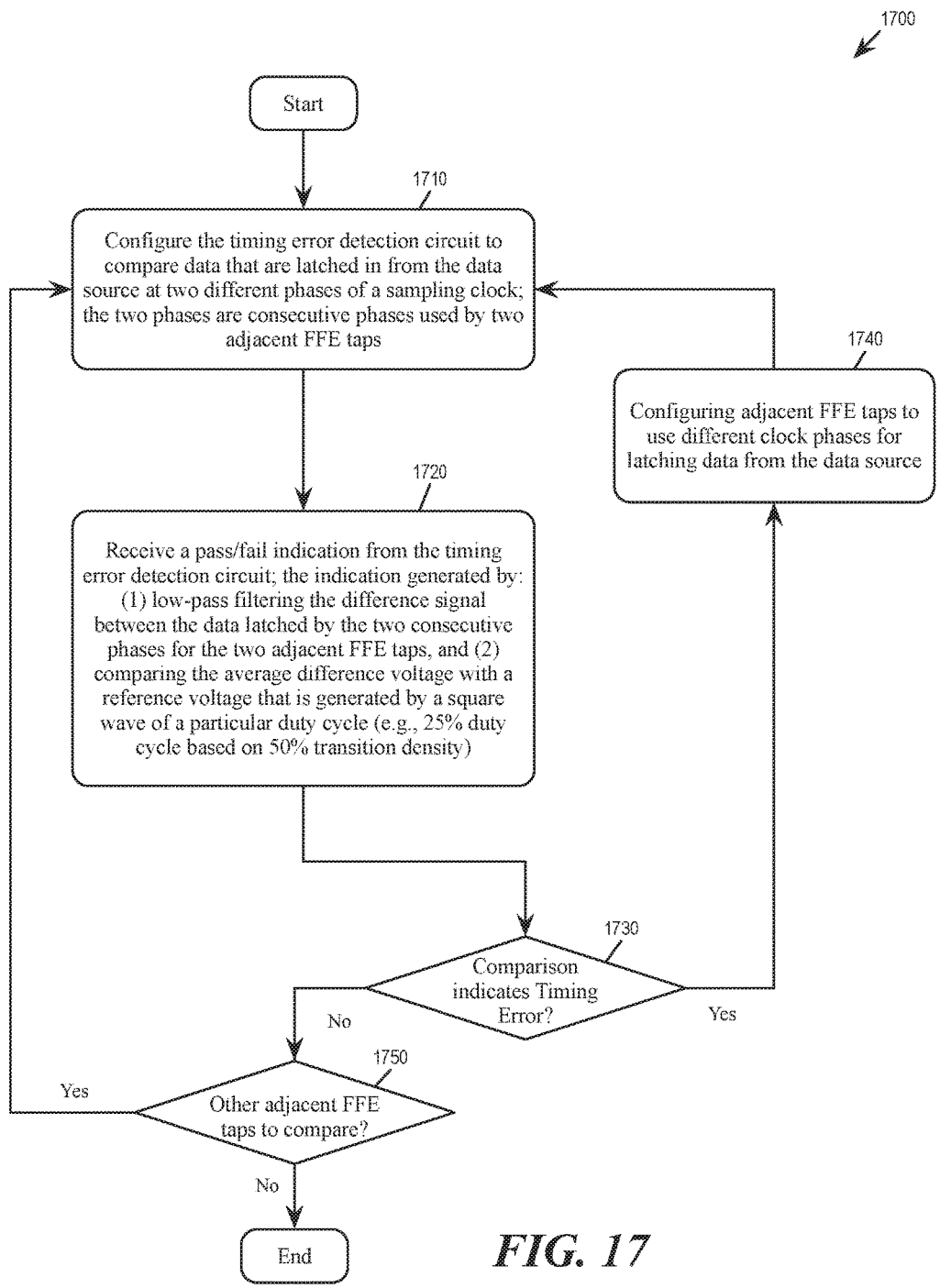
FIG. 17 conceptually illustrates a process for calibrating the selection of clock phases for a serial transmitter, consistent with an exemplary embodiment.

FIG. 17 conceptually illustrates a process 1700 for calibrating the selection of clock phases for a serial transmitter, consistent with an exemplary embodiment. The selected clock phases are for serializing data received from a data source. The calibration operation tries to find clock phases that would provide sufficient timing margins for sampling the data source. In some embodiments, one or more processing units (e.g., a processor) of a computing device controlling the serial transmitter perform the process 1700. In some embodiments, one or more processing units (e.g., a processor) embedded in an IC that includes the serial transmitter perform the process 1700. The one or more processing units may perform both the process 1100 and the process 1700 to configure the driver segments of the serial transmitter and to calibrate the selection of sampling clock phases.

The processor starts the process 1700 by configuring (at 1710) the timing detection circuit to compare data sampled from the data source at two different phases of a sampling clock. Specifically, the two phases are consecutive phases of the sampling clock that are used to sample data for two adjacent taps of the serial transmitter's FFE (e.g., pre-cursor tap and the main-cursor tap.)

The processor then receives (at 1720) a pass/fail indication from the timing error detection circuit. The pass/fail indication is generated by: (i) low-pass filtering a difference signal between the data sampled at the two consecutive phases of the sampling clock for the two adjacent FFE taps and (ii) comparing the average difference voltage with a reference voltage that is generated by a square wave of a particular duty cycle (e.g., 25% duty cycle based on 50% transition density). FIG. 14 above illustrates an example timing error detection circuit. FIG. 16 above illustrates an example generation of the reference voltage.

Next, the processor determines (at 1730) whether the comparison between the average differential voltage with the reference voltage indicates timing error, i.e., whether the average difference voltage exceed the reference voltage. If the average difference voltage is less than reference voltage to indicate that there is no timing error, the process proceeds to 1750. If the average difference voltage exceeds the reference voltage to indicate that there is timing error, the process proceeds to 1740.

At 1740, the processor configures the FFE taps of the serial transmitter to use different clock phases for sampling data from the data source. Specifically, the revised configuration data reconfigures the pre-cursor tap, main-cursor tap, and post-cursor tap of the serial transmitter FFE to use a later clock phase for latching the data (e.g., use clock phases 3, 4, 1 instead of clock phases 2, 3, 4), thereby providing more timing margin for setup time requirement. In some embodiments, the processor generates a revised set of configuration data to reconfigure the driver segments of the serial transmitter. In some embodiments, the revised configuration data is for reconfiguring the driver segments of the serial transmitter to use different C4 clock phases to sample the data source or to use different C2 clock phases to sample the half-rate data. An example of reconfiguring the driver segments for changing the clock phase selection is described by reference to FIG. 12a and FIG. 12b above. After reconfiguring the selection of clock phases for FFE taps, the process 1700 returns to 1710 to configure the timing error detection circuit to detect timing errors based on the clock phase selection in the revised configuration.

At 1750, the processor determines whether there are other consecutive sampling clock phases that correspond to other adjacent FFE taps (e.g., main-cursor tap and post-cursor tap). Timing error may manifest itself as inconsistent data between pre-cursor tap and main-cursor tap, or between the main-cursor tap and the post-cursor tap. After checking for timing error by comparing the data sampled at the pre- and main-cursor taps, the process 1700 check for timing error by comparing the data sampled at the main- and post-cursor taps. If the processor has already compared each pair of adjacent FFE taps, the process 1700 ends. If there are other adjacent FFE taps yet to be compared for timing error detection, the process 1700 returns to 1710 to configure the timing error detection circuit to check for timing errors based on those adjacent FFE taps.

Example Electronic System

The present application may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. The flowchart and block diagrams in the Figures (e.g., FIGS. 11 and 17)

illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 18:
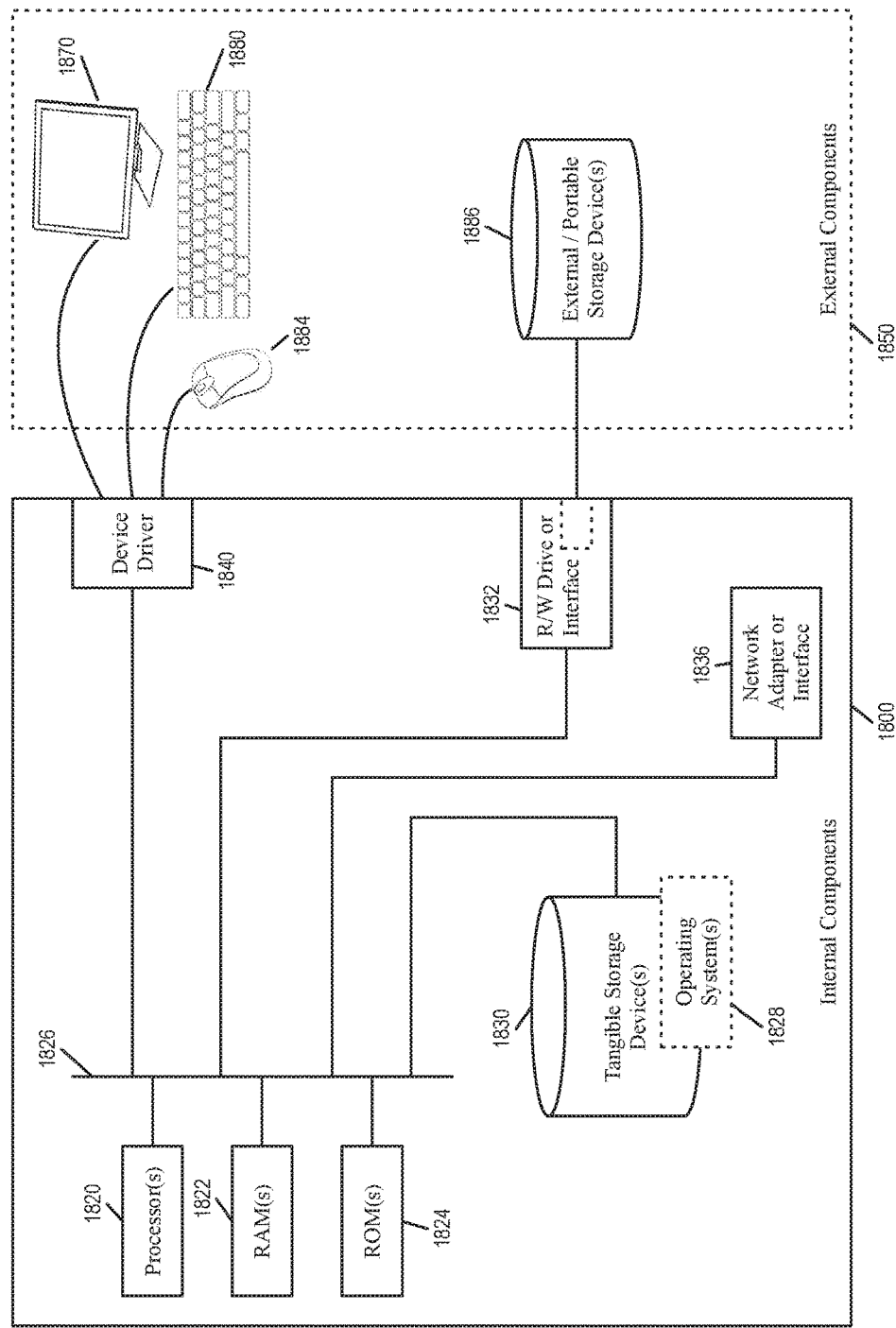
FIG. 18 shows a block diagram of the components of a data processing system in accordance with an illustrative embodiment of the present disclosure.

FIG. 18 shows a block diagram of the components of data processing systems 1800 and 1850 that may be used to implement a system controlling and configuring a serial transmitter in accordance with an illustrative embodiment of the present disclosure. It should be appreciated that FIG. 18 provides only an illustration of one implementation and does not imply any limitations with regard to the environments in which different embodiments may be implemented. Many modifications to the depicted environments may be made based on design and implementation requirements.

Data processing systems 1800 and 1850 are representative of any electronic device capable of executing machine-readable program instructions. Data processing systems 1800 and 1850 may be representative of a smart phone, a computer system, PDA, or other electronic devices. Examples of computing systems, environments, and/or configurations that may represented by data processing systems 1800 and 1850 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The data processing systems 1800 and 1850 may include a set of internal components 1800 and a set of external components 1850 illustrated in FIG. 18. The set of internal components 1800 includes one or more processors 1820, one or more computer-readable RAMs 1822 and one or more computer-readable ROMs 1824 on one or more buses 1826, and one or more operating systems 1828 and one or more computer-readable tangible storage devices 1830. The one or more operating systems 1828 and programs such as the programs for executing the processes 1100 and 1700 are stored on one or more computer-readable tangible storage devices 1830 for execution by one or more processors 1820 via one or more RAMs 1822 (which typically include cache memory). In the embodiment illustrated in FIG. 18, each of the computer-readable tangible storage devices 1830 is a magnetic disk storage device of an internal hard drive. Alternatively, each of the computer-readable tangible storage devices 1830 is a semiconductor storage device such as ROM 1824, EPROM, flash memory or any other computer-readable tangible storage device that can store a computer program and digital information.

The set of internal components 1800 also includes a R/W drive or interface 1832 to read from and write to one or more portable computer-readable tangible storage devices 1886 such as a CD-ROM, DVD, memory stick, magnetic tape, magnetic disk, optical disk or semiconductor storage device. The instructions for executing the processes 1100 and 1700 can be stored on one or more of the respective portable computer-readable tangible storage devices 1886, read via the respective R/W drive or interface 1832 and loaded into the respective hard drive 1830.

The set of internal components 1800 may also include network adapters (or switch port cards) or interfaces 1836 such as a TCP/IP adapter cards, wireless Wi-Fi interface cards, or 3G or 4G wireless interface cards or other wired or wireless communication links. Instructions of processes or programs described above can be downloaded from an external computer (e.g., server) via a network (for example, the Internet, a local area network or other, wide area network) and respective network adapters or interfaces 1836. From the network adapters (or switch port adaptors) or interfaces 1836, the instructions and data of the described programs or processes are loaded into the respective hard drive 1830. The network may comprise copper wires, optical fibers, wireless transmission, routers, firewalls, switches, gateway computers and/or edge servers.

The set of external components 1850 can include a computer display monitor 1870, a keyboard 1880, and a computer mouse 1884. The set of external components 1850 can also include touch screens, virtual keyboards, touch pads, pointing devices, and other human interface devices. The set of internal components 1800 also includes device drivers 1840 to interface to computer display monitor 1870, keyboard 1880 and computer mouse 1884. The device drivers 1840, R/W drive or interface 1832 and network adapter or interface 1836 comprise hardware and software (stored in storage device 1830 and/or ROM 1824).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) comprising:
a data source configured to provide data for serial transmission;
a clock source configured to produce N versions of a sampling clock that are at N different phases of the sampling clock;
a first sampler configured to sample the data source by using a first phase of the sampling clock to generate a first sampled signal;
a second sampler configured to sample the data source by using a second phase of the sampling clock to generate a second sampled signal;
a first comparator configured to compare the first and second sampled signals to generate a difference signal;
a first low-pass filter configured to filter the differential signal to generate an average difference voltage; and
a second comparator configured to compare the average difference voltage with a reference voltage.

2. The IC of claim 1, further comprising a feed-forward equalizer (FFE) configured to use a plurality of phases of the sampling clock to implement a plurality of taps of the FFE, wherein the first and second phases are used as two adjacent tap of the FFE.

3. The IC of claim 1, further comprises a serial transmitter that uses the sampling clock to serialize and transmit data from the data source at a rate of one symbol per unit interval, wherein the sampling clock is a half-rate clock having a period that is twice a unit interval, wherein first and second phases are consecutive phases separated by a fraction of a unit interval.

4. The IC of claim 1, further comprising a second low-pass filter configured to generate the reference voltage by filtering a square wave having a duty cycle of 1/N.

5. A method comprising:
sampling a data source by using first and second phases of a sampling clock to generate corresponding first and second sampled signals, respectively;
comparing the first and second sampled signals to generate a difference signal;
low-pass filtering the difference signal to generate an average difference voltage; and
comparing the average difference voltage with a reference voltage to determine whether the data source satisfies a timing requirement with respect to the first phase of the sampling clock.

6. The method of claim 5, wherein the reference voltage is generated by low-pass filtering a square wave having a particular duty cycle, wherein the particular duty cycle is determined based on a timing spacing between the first and second phases of the sampling clock.

7. The method of claim 5, further comprising using the sampling clock to serialize and transmit data from the data source at a rate of one symbol per unit interval (UI), wherein the sampling clock is a half-rate clock having a period that is twice the UI.

8. The method of claim 7, wherein the first and second phases are consecutive phases separated by half-UI.

9. The method of claim 7, wherein sampling the data source further comprises using a quarter-rate clock having a period that is four times the UI to latch and multiplex the data source to produce a half-rate data for sampling based on the sampling clock.

10. The method of claim 5, further comprising using at least three phases of the sampling clock to implement at least three taps of a feed-forward equalizer (FFE) for an output of a serial transmitter, wherein the first and second phases are respectively used for adjacent taps of the FFE.

11. The method of claim 10, further comprising assigning different phases of the sampling clock to implement the FFE taps when the average difference voltage is greater than the reference voltage.

12. The method of claim 5, wherein the sampling clock comprises quadrature phases that include the first and second phases.

13. A computer-implemented method comprising:
configuring a timing error detection circuit of a serial transmitter to compare data that are sampled from a data source by using first and second phases of a sampling clock, the first and second phases being used for generating data for two adjacent taps of a feed-forward equalizer (FFE) of the serial transmitter;
receiving a timing error indication from the timing error detection circuit, wherein the indication is generated by: (i) comparing the data sampled at the first and second phases to generate a difference signal (ii) low-pass filtering the difference signal to generate an average difference voltage, and (ii) comparing the average difference voltage with a reference voltage; and
configuring the serial transmitter to use different phases of the sampling clock for generating data for two adjacent taps of the FFE based on the timing error indication.

14. The computer-implemented method of claim 13, wherein the timing error indication indicates a timing error when the average difference voltage is greater than the reference voltage.

15. The computer-implemented method of claim 13, wherein the different phases of the sampling clock are the first phase and another phase that is a later phase of the sampling clock than the first phase.

16. The computer-implemented method of claim 13, wherein the reference voltage is generated by low-pass filtering a square wave having a particular duty cycle, wherein the particular duty cycle is determined based on a timing spacing between the first and second phases of the sampling clock.

17. The computer-implemented method of claim 13, wherein the particular duty-cycle is 25%.

18. The computer-implemented method of claim 13, wherein the sampling clock is used to serialize and transmit data from the data source at a rate of one symbol per unit interval (UI), wherein the sampling clock is a half-rate clock having a period that is twice the UI.

19. The computer-implemented method of claim 18, wherein the first and second phases are consecutive phases separated by a fraction of the UI.

20. The computer-implemented method of claim 18, wherein sampling the data source comprises using a quarter-rate clock having a period that is four times the UI to latch and multiplex the data source to produce a half-rate data for sampling based on the sampling clock.

* * * * *